United States Patent [19]
Taylor et al.

[11] Patent Number: 5,946,218
[45] Date of Patent: Aug. 31, 1999

[54] SYSTEM AND METHOD FOR CHANGING THE CONNECTED BEHAVIOR OF A CIRCUIT DESIGN SCHEMATIC

[75] Inventors: Ronald L. Taylor, Meridian; Larren Gene Weber, Calwell, both of Id.

[73] Assignee: Micron Technology, Inc., Boise, Id.

[21] Appl. No.: 09/145,734

[22] Filed: Sep. 2, 1998

Related U.S. Application Data

[63] Continuation of application No. 08/660,110, Jun. 7, 1996, Pat. No. 5,815,402.

[51] Int. Cl.$^6$ .................................................. G06F 17/50
[52] U.S. Cl. .......................................... 364/488; 364/578
[58] Field of Search ..................................... 364/488, 489, 364/490, 491, 578

[56] References Cited

U.S. PATENT DOCUMENTS

| | | | |
|---|---|---|---|
| 4,831,543 | 5/1989 | Mastellone | 364/489 |
| 5,111,413 | 5/1992 | Lazansky et al. | 364/578 |
| 5,384,710 | 1/1995 | Lam et al. | 364/489 |
| 5,463,563 | 10/1995 | Bair et al. | 364/490 |
| 5,548,524 | 8/1996 | Hernandez et al. | 364/489 |

OTHER PUBLICATIONS

"Analog Expression Language", *Reference Manual (Version 4.3)*, Cadence, 3 pages, (Mar. 1994).
"Spectre", *Reference Manual (Version 4.3.4)*, Cadence, 6 pages, (Jun. 1995).
"Vampire", *Reference Manual (Version 1.1)*, Cadence, 5 pages, (Jun. 1995).

Bryant, R.E., "A Switch–level Model and Simulator for MOS Digital Systems", *IEEE Transactions on Computers, C–33*, 2, 160–177, (1984).

Hajj, I.N., et al., "Simulation of Physical Faults in VLSI Circuits", *IEEE VLSI Test Symposium Paper 9.4*, 202–207, (1992).

Jones, L.G., "An Incremental Zero–Integer Delay Switch–Level Simulation Environment", *IEEE Transactions on Computer–Aided Design*, 11, 9, 1131–1139, (1992).

*Primary Examiner*—Kevin J. Teska
*Assistant Examiner*—Leigh Marie Garbowski
*Attorney, Agent, or Firm*—Schwegman, Lundberg, Woessner & Kluth, P.A

[57] ABSTRACT

A method and system for changing the connected behavior of a circuit design schematic at the time a netlist is being created by assigning instance parameters to each switch instance, the parameter having a value representing that the position of the switch is open or closed, the parameter being evaluated at the time the netlist is created to determine the position of the switch. When the netlist being created is a flat netlist, a closed switch condition is represented by printing information to the netlist file that identifies the nets being interconnected. When the netlist being created is a hierarchical netlist, the nets being interconnected are declared as "artificial" ports, allowing these nets to be tracked through the hierarchy to instances at which the parameters are evaluated and to provide a connection between these nets, allowing the interconnection of nets to be specified at a level in the hierarchy other than that at which the switch is declared.

55 Claims, 35 Drawing Sheets

Flat Netlist 502

| | |
|---|---|
| 5.1 | * net 3 vpp! |
| 5.2 | * net 2 vcc! |
| 5.3 | * net 1 vbb! |
| 5.4 | * net 0 gnd! |
| 5.5 | * net 4 /Aout |
| 5.6 | * net 5 /Bout |
| 5.7 | * net 6 /Bin |
| 5.8 | * net 7 /Ain |
| 5.9 | * net 9 /I2/net6 |
| 5.10 | * net 10 /I2/net3 |
| 5.11 | * switch (0) = /I2/RSW3 |
| 5.12 | * ncap(1) = /I2/mnc5 |
| 5.13 | m1 0 10 0 1 N 1='1.0' w = '10.0' |
| 5.14 | * resistor(2) = /I2/r4 |
| 5.15 | r2 0 10   R = 100e3 |
| 5.16 | * nn(3) = /I2/GI1/MNA |
| 5.17 | M3 5 9 0 1 N 1 = '1.0' w = '10.0' |
| 5.18 | * pp(4) = /I2/GI1/MPA |
| 5.19 | M4 5 9 2 2 P 1 = '1.0' w = '15.0' |
| 5.20 | * nn(5) = /I2/GI0/MNA |
| 5.21 | M5 9 6 0 1 N 1 = '1.0' w = '10.0' |
| 5.22 | * pp(6) = /I2/GI0/MPA |
| 5.23 | M6 9 6 2 2 P 1 = '1.0' w = '15.0' |

FIG. 5A

Flat Netlist 502 (con't)

5.24   * net 24 /I1/net 6
5.25   * net 25 /I1/net 3
5.26   * switch (7) = /I1/RSW3
5.27   R7 25 24 R =0.1
5.28   * ncap(8) = /I1/mnc5
5.29   M8 0 25 0 1 N 1='1.0' w = '10.0'
5.30   * resistor(9) = /I1/r4
5.31   r9 0 25   R = 100e3
5.32   * nn(10) = /I1/GI1/MNA
5.33   M10 4 24 0 1 N 1 = '1.0' w = '10.0'
5.34   * pp(11) = /I1/GI1/MPA
5.35   M11 4 24 2 2 P 1 = '1.0' w = '15.0'
5.36   * nn(12) = /I1/GI0/MNA
5.37   M12 24 7 0 1 N 1 = '1.0' w = '10.0'
5.38   * pp(13) = /I1/GI0/MPA
5.39   M13 24 7 2 2 P 1 = '1.0' w = '15.0'

FIG. 5B

```
1   procedure( MSfnSwitchElementString( )
2       when( (MSfnlSearchPropString("position" t) = = "0" )
3           fn1Print ( "R" )
4           fnlPrint( fnlCurrentInstExtName)
5           foreach( term
6               MSfnlMeasCurrent ( MSfnlTermsEval ( 'termOrder))
7               fnlPrint ( strcat( " " term) )
8           )
9           fnlPrint ( " R=0.1\n")
10      )
11  )
12  ; ©1996, Micron Technology, Inc.
```

FIG. 10

```
1   procedure( MSfnSwitchElementString ( )
2       let( ( space)
3           fnlPrint( "i")
4           fnlPrint( fnlCurrentInstExtName)
5           fnlPrint( "" )
6
7           ; position
8           if( evalstring(
9               fnlSearchPropString ( "position" t)) = = 0.0 then
10              fnlPrint( "optin")
11          else
12              fnlPrint( "optout")
13          )
14
15          ; terms
16          foreach( term MSfnlTermsEval( 'termOrder)
17              fnlPrint( strcat( " " term) ) )
18          )
19          fnlPrint("\n")
20      )
21  )
22  ; ©1996, Micron Technology, Inc.
```

FIG. 12

Hierarchical Netlist 1302

13.1 .GLOBAL vcc gnd
13.2
13.3 * Cell: inv
13.4 .subckt inv a y
13.5 MNA y a gnd gnd N l = 'lnA' w= 'wnA'
13.6 MPA y a vcc vcc P l = 'lpA' w= 'wpA'
13.7 .ends inv
13.8
13.9 *Cell: bottom
13.10 .subckt bottom in out net3 net6
13.11 r4 gnd net3 R=100e3
13.12 mnc5 gnd net3 gnd gnd N l = 1.0 w = 10.0
13.13 xGI0 in net6 inv lnA = 1.0 wnA = 10.0 lpA = 1.0 wpA = 15.0
13.14 xGI1 net6 out inv lnA = 1.0 wnA = 10.0 lpA = 1.0 wpA = 15.0
13.15 .ends bottom
13.16
13.17 * Cell: top (top level cell)
13.18 xi1 Ain Aout I1_net3 I1_net6 bottom
13.19 rmsil_0 I1_net3 I1_net6 R = 0.1
13.20 xi2 Bin Bout I2_net3 I2_net6 bottom

FIG. 13

```
1171    ; ©1996, Micron Technology, Inc.
1172    if( cellname  = = "switch" then
1173       ; set up global variables for later use when soft switches are evaled.
1174       _MS_HN_SW _ PREFIX = MShnlGet( cellName 'namePrefix)
1175       _MS_HN_SW_VAL = hnlCurrentInst->R
1176
1177       tmp = MShnlEvalParam("position")
1178       if( cadr( tmp) then
1179          ; switch position is determined by pPar()
1180          _MS_HN_SWITCH_TERMS = cons(list(tmp
1181                                          list(
hnlNetNameOnTerm( car( car(instLine->terms)) 0)
1182                                               hnlNetNameOnTerm(
car(cadr(instLine->terms)) 0)))
1183                                          _MS_HN_SWITCH_TERMS)
1184       else
1185          ; switch is defined at this level - the parameter "position" evaluates to a
1186          ; string representation of an integer.
1187          when( zerop( evalstring( car( tmp)))
1188             tmpl = MS_hnlMapName( MShnlGet(cellName 'name-
Prefix) strcat( "MS" hnlCurrentInstName) nil)
1189             _MS_HN_INSTS[tmpl] = copy( instLine)
1190             _MS_HN_INSTS[tmpl]->params = list( list( "R" hnlCurrentInst-
>R))
1191          )
1192       )
```

FIG. 28A

```
1193    instLine->params = list( list( "R" car( MShnlEvalParam("RLVS"))))
1194    else
1195        instLine->params = MS_hnlGetParams( MShnlGet(
cellName 'instParameters))
1196    )
1197    ; name
1198    tpm = MS_hnlMapName (cellName 'namePrefix hnlCurrentInstName)
1199    if ( cellName = = "switch" then
1200        _MS_HN_LVS_INSTS[tmp] = instLine
1201    else
1202        _MS_HN_INSTS [tmp] = instLine
1203    )
1204    ; ©1996, Micron Technology, Inc.
```

FIG. 28B

```
1370    ; © 1996, Micron Technology, Inc.
1371    ; create a table of artificial ports for soft switches,
1372    swTermTable = ncons( nil)
1373    foreach( term MShnlGet( cellName 'swPorts)
1374            putprop( swTermTable strcat( hnlCurrentInstName "_"
term) concat(term)))
1375
1376    ;switch terminals
1377    foreach( switch MShnlGet( cellname 'swParams)
1378            tmp = car(car(switch))
1379            tmpl = nil
1380            foreach( param cadr(car(switch))
1381                    paramVal = MShnlEvalParam( param)
1382                    when( car(paramVal) = = " "
1383                            MSsiErr( "parameter \"%s\" is missing on %s in
%s - assuming a value of \"0\".\n"
1384                                    param
1385                                    hnlCurrentInstName
1386                                    hnlCurrentCell->cellName)
1387                            paramVal = list("0")
1388                    )
1389                    rexCompile(param)
1390                    tmp = rexReplace( tmp car(paramVal) 0)
1391                    tmpl = append( tmpl cadr(paramVal))
1392            )
1393            if( tmpl then
1394                    ; hier switch is not yet evaled so pass up ports
and params to eval.
1395                    _MS_HN_SWITCH_TERMS = cons( list( list( tmp tmpl
1396                                                        cadr(
MS_hnlSwTerms( cadr(switch) swTermTable)))
1397                                                        MS_HN_SWITCH
_TERMS)
1398            else
1399                    ; hier switch evaled at this instance so insert resistor between
shorted ports.
1400                    paramVal = evalstring(tmp)
1401                    when( paramVal == 0
1402                            swTerms = cadr(switch)
1403                            when( swTerms
1404                                    swTerms = MS_hnlSwTerms( swTerms
swTermTable)
```

FIG. 29A

```
1405            swnets = MS_hnlMapNetNames( cadr( swTerms))
1406            swTerms = mapcar( 'hnlMapNetName list("A'
"B"))
1407            tmp = MS_hhlMapName( _MS_HN_SW_PREFIX
get_string( gensym( strcat( "MS" hnlCurrentInstName "_"))) nil)
1408            _MS_HN_INSTS[tmp]
1409                list( nil
1410                    'model    " "
1411                    'class    " "
1412                    'terms mapcar( 'list swTerms swNets)
1413                    'params  list( list("R"
_MS_HN_SW_VAL))
1414                    'dbid hnlCurrentInst
1415                    'cellName hnlMapModelName (
"switch")
1416                    'stopRep t)
1417                )
1418            )
1419        )
1420        swNets = nil
1421    )
1422    swTerms = MShnlGet ( cellname 'swPorts)
1423    when( swTerms
1424        swTerms = MS_hnlSwTerms( swTerms swTermTable)
1425        swNets = cadr(swTerms)
1426        swTerms = car(swTerms)
1427    )
.
.
.
1454    ; combine the terminal information
1455    instLine->terms = mapcar( 'list
1456                append( realTerms swTerms)
1457                MS_hnlMapNetNames( append( realNets
swNets)))
.
.
.
1495    _MS_HN_INSTS[tmp] = instLine
1496    ; ©1996, Micron Technology, Inc.
```

FIG. 29B

```
639    ; ©1996, Micron Technology, Inc.
640    let( ( tmp swTerms)
641            ; find all of the soft switch terminals.
642            foreach( switch _MS_HN_SWITCH_TERMS
643                    tmp = setof( term cadr(switch) !member( term append(
hnlCellNetsOnTerms _MS_HN_TERMS)))
644                    when( tmp
645                            foreach( net tmp
646                                    unless( member( net swTerms)
647                                            swTerms = appendl( swTerms net))
648                            )
649                    )
650            )
651            _MS_HN_SIMINFO[namel = list( nil
  .
  .
  .
659                    'swTerms mapcar( 'hnlMapNetName swTerms
                       ; Mapped nets for soft switch connection.
660                    ; ("msi5netl4" "mapvccl" "mapgndl")
661                    'swPorts swTerms
                       ; UnMapped swTerms
662                    ; ("MSI5netl4" "Mapvccl" "Mapgndl")
663                    'swParams MS_HN_SWITCH_TERMS
                       ; Data structure to evaluate switches
664                    ; ((("top-0.0" ("top")) ("MSI5netl4", "Mapvccl")) ... )
  .
  .
666            )
667    )
```

FIG. 30

SYSTEM AND METHOD FOR CHANGING THE CONNECTED BEHAVIOR OF A CIRCUIT DESIGN SCHEMATIC

This application is a continuation of U.S. application Ser. No. 08/660,110 filed Jun. 7, 1996 now U.S. Pat. No. 5,815,402, Sep. 29, 1998.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyrights whatsoever.

FIELD OF THE INVENTION

The present invention relates generally to the design and testing of integrated circuit devices, and in particular, the present invention relates to a system and method for changing the connected behavior of a circuit design schematic by interpreting instance parameters at the time a netlist is being created.

BACKGROUND OF THE INVENTION

Today's integrated circuits contain many circuit elements. Computer-aided design (CAD) and computer-aided engineering (CAE) tools are essential in producing these complicated integrated circuits. Circuit design can be represented by a schematic. Schematics consist of symbol instances connected by nets which demonstrate the functional design of the circuit. Symbol instances are pictorial icons that represent a complete functional block. Symbol instances can be primitive elements, such as transistors and resistors. Moreover, symbol instances can also be abstractions of combinations of primitive elements, such as NAND gates and NOR gates. Symbol instances can also be higher level groupings of these various elements. CAD software can be used to produce the complicated schematics of an integrated circuit. CAD software allows symbols to be saved in libraries for use by many circuit designers. Portions of the integrated circuit can be easily replicated, deleted, and changed with the CAD software.

However, the massive complexity of current circuits introduces problems in circuit design. Because a typical circuit can contain several million individual instances which are connected by several million nets, a change in design implementation may necessitate the same change to many corresponding blocks of the circuit.

In designing integrated circuit devices, a design engineer may include switches in a low level cell schematic to establish connections in portions of a circuit being designed. Such switches allow components, such as transistors, resistor, or capacitors, to be connected into a circuit of a cell, or not, depending upon the operation required for the circuit.

At the time of designing a low level schematic, the design engineer may not know whether the switches will be configured as open or closed switches. Moreover, with continued design to higher levels, it may be required that the state of a switch in one or more cells be changed to be opposite to that for which it had been established. However, many conventional design processes require that each switch condition be specified at the time that the switch is created. Consequently, a different schematic must be created for each basic function of a cell. This complicates the design procedure, particularly in the case where a cell is replicated during the design process and where a cell is expected to function differently for different placements.

One known design software that is used in computer-aided design includes schematic libraries providing a switch having a functionality that interconnects two nets of a circuit. The design software is commercially available under the tradename ANALOG ARTIST from Cadence Design Systems, Inc. San Jose, Calif. The switch function provided by commercially available design software, such as the Cadence design software, does not provide any mechanism for modifying switch behavior based on inherited parameters.

Another option for reconfiguring the behavior of a circuit is to maintain a database that contains several versions of a basic cell with the appropriate version of the cell being placed for each instance. However, when there is more than one version of a cell, maintenance overhead and the probability of design errors increase substantially.

The most common approach is to replace the switches with ports and hard wire the ports, such as by placing a wire between terminals to be shorted, to establish the desired switch conditions. However, this approach requires adding numerous terminals to the database solely for the purpose of providing flexibility in switch configuration. In addition, this approach also increases the probability of error because if any of the terminals are wired incorrectly, such incorrect wiring may not be readily apparent.

For the reasons stated above, and for other reasons stated below which will become apparent to those skilled in the art upon reading and understanding the present specification, there is a need in the art for a method and system for use in the design and testing of integrated circuit devices and which allows the connected behavior of a circuit design schematic to be changed at the time the netlist is being created.

SUMMARY OF THE INVENTION

The present invention provides a system and method for changing the connected behavior of a circuit design schematic by interpreting instance parameters at the time a netlist is being created. According to the invention, a parameter is assigned to each instance on the schematic that contains a switch, the parameter having a value representing that the position of the switch is open, closed or is determined at a higher level of schematic hierarchy, the parameter being evaluated at the time the netlist is created to determine the position of the switch. When the netlist being created is a flat netlist, a closed switch condition is represented. When the netlist being created is a hierarchical netlist, "artificial" ports and nets are declared when necessary, allowing nets at lower levels to be tracked through the hierarchy to the instance at which the parameter is evaluated and at that level a closed switch condition is represented. The method comprises defining the condition of the selected switch in terms of a user-defined parameter that can be specified to indicate either one of the first and second conditions.

The present invention allows all of the basic functions of cells to be defined by one schematic. Consequently, maintenance is easier and the schematic designer can wire instances within a schematic in a consistent manner, so that the probability of error is reduced. Moreover, the present invention helps a schematic designer encapsulate the complete switching behavior of a cell with all of its permutations. Switch position can easily be displayed at any level of hierarchy by adding a label that displays switch position to any symbol containing a switch parameter. The switch function provided by the invention is particularly useful in an environment where a cell is replicated during the design operation process and where that cell is expected to function differently for different placements. In such application, the present invention obviates the need to create a large number of cells that have essentially the same function and also eliminates the need to create cells that require a large number of input/output ports.

BRIEF DESCRIPTION OF THE DRAWINGS

FIGS. 5A and 5B are a flat netlist created by a flat netlister program for the schematic of FIG. 3;

FIG. 10 is a listing of an exemplary code segment for conducting the switch specific procedure "MSfnSwitchElementString" for the HSPICE simulator;

FIG. 12 is a listing of an exemplary code segment for conducting the switch specific procedure "MSfnSwitchElementString" for the DIVA LVS simulator;

FIG. 13 is a hierarchical netlist created by a netlister program for the schematic of FIG. 3;

FIGS. 28A and 28B are a listing of an exemplary code segment for dealing with a primary instance in accordance with the process of FIG. 23;

FIGS. 29A and 29B are a listing of an exemplary code segment for dealing with a sub-circuit instance in accordance with the process of FIG. 26;

FIG. 30 is a listing of an exemplary code segment for completing a sub-circuit in accordance with the process of FIG. 24;

DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that changes may be made without departing from the spirit and scope of the present inventions. The following detailed description is, therefore, not to be taken in a limiting sense, and the scope of the present inventions is defined only by the appended claims.

Figure 1:
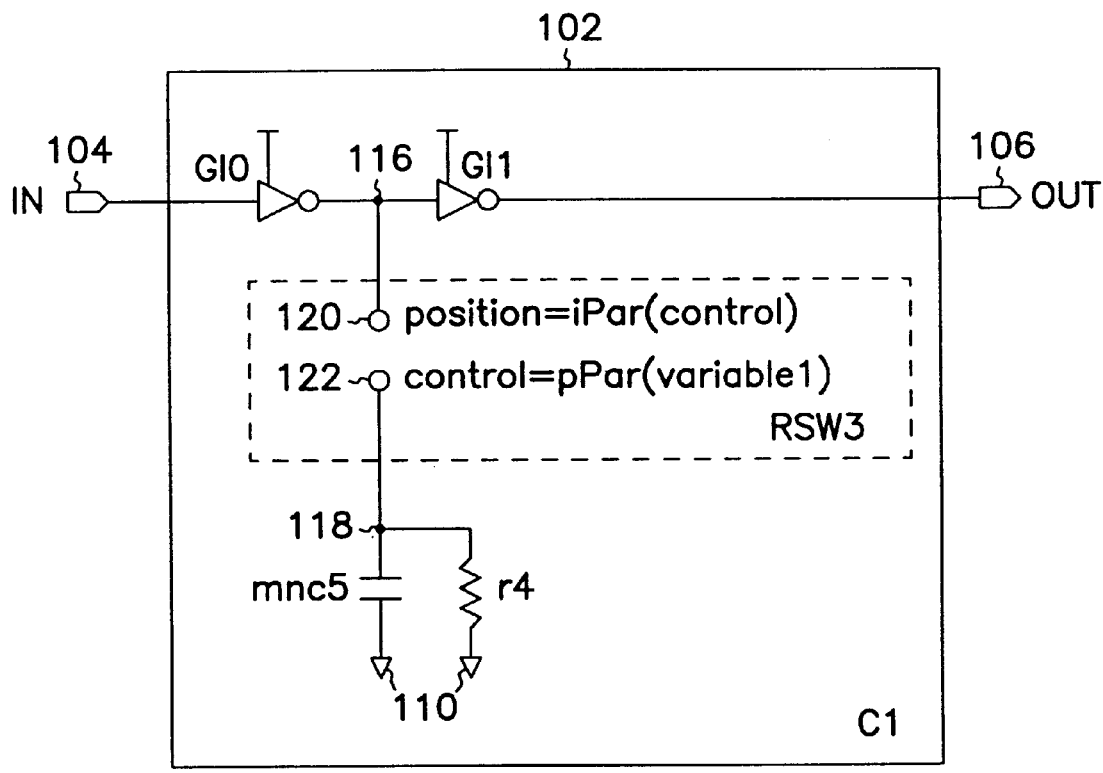
FIG. 1 is a schematic of an exemplary circuit of a cell that includes a switch, and representing one level of hierarchy.

Referring to FIG. 1, the switch function provided by the present invention is described with reference to an application to a circuit of a cell or block C1 which is represented by the schematic 102. The schematic 102 shown in FIG. 1 can be created by using a computer-aided engineering (CAE) tool. One such CAE or schematic design tool is ANALOG ARTIST design tool available from Cadence Design Systems, Inc., San Jose, Calif.

The switch function provided by the invention allows the connectivity of a circuit to be changed by assigning a parameter to an instance of a circuit. This allows the designer, at an arbitrary level in hierarchy, to change the value of the parameter of an instance to change how the circuit is connected. As will be described, in the exemplary embodiment shown in FIG. 1, a one-position switch provided in accordance with the invention connects a network including a resistance and a capacitance in circuit with a pair of inverters. In another embodiment, shown in FIG. 18, a schematic 1802 includes a two-position switch provided in accordance with the invention completes one of two circuit path portions, one being a direct connection and the other path portion including an inverter.

The switch provided in accordance with the invention is configured by assigning a parameter to an instance in a schematic and evaluating the parameters, at the time the netlist is being created. Many different types of "connections" can be programmed using the switch function of the invention, and thus, the circuit of the schematic 102 of FIG. 1 and the circuit shown in FIG. 18, to be described, are merely examples of two applications of the switch function according to the invention.

Schematic

Considering the schematic 102 in more detail, the cell C1 includes inverter GI0, an inverter GI1, a capacitor mnc5, and a resistor r4. The cell C1 has a signal input port 104, a signal output port 106, and global net 110 or gnd!. The cell has an internal node or net 116 and an internal node or net 118. Inverter GI0 has an input connected to input port 104 and an output connected to internal net 116. Inverter GI1 has an input connected to internal net 116 and an output connected to output port 106. Capacitor mnc5 is connected between internal net 118 and ground. Resistor r4 is connected between internal net 118 and ground, in parallel with capacitor mnc5.

In designing integrated circuit devices, it is possible for the design engineer to include switches in a low level cell schematic which enable a circuit, or components of a circuit, such as transistors, resistors, or capacitors, to be connected into a circuit of a cell, or not, depending upon the operation required for the circuit. In the exemplary embodiment, the cell C1 includes an instance of a "switch", identified as RSW3 in FIG. 1. The "switch" RSW3 is not a switch in the conventional sense, rather "switch" RSW3 simulates the function of a conventional switch in that it can be configured to a closed or an open position. In the closed position, switch RSW3 connects the resistor and the capacitor to net 116 between the inverters GI0 and GI1. In the open position, switch RSW3 does not complete a path between nets 116 and 118 so that the resistor and capacitor are not connected in circuit with the inverters. The position of the switch RSW3 is established or determined by assigning properties or parameters to the cell C1 as will be described.

Figure 2:
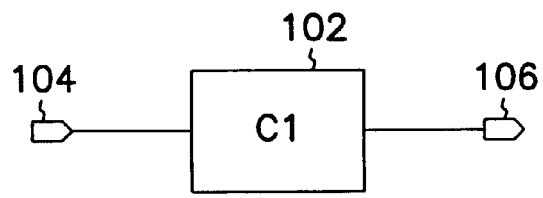
FIG. 2 shows the symbol for the circuit of FIG. 1.

FIG. 2 shows the symbol for the cell C1 that includes the circuit shown in schematic 102 of FIG. 1. The symbol illustrated in FIG. 2 includes a block labeled "C1" having an input corresponding to input port 104, and an output 106 corresponding output port 106.

Figure 3:
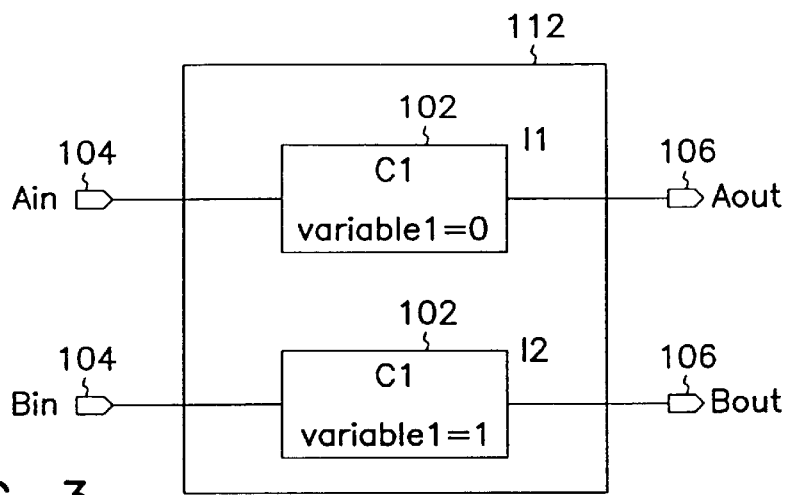
FIG. 3 is a schematic having two instances of placement of the symbol of FIG. 2 on a schematic.

Referring now to FIG. 3, two instances I1 and I2 of the cell or block C1, or two symbol placements of the symbol for the cell C1 of FIG. 2, are diagramed in a schematic 112. Instance I1 has an input port Ain corresponding to port 104 of cell C1 and an output port Aout corresponding to port 106 of cell C1. Similarly, instance I2 has an input port Bin corresponding to port 104 of cell C1 and an output port Bout corresponding to port 106 of cell C1.

Figure 4:
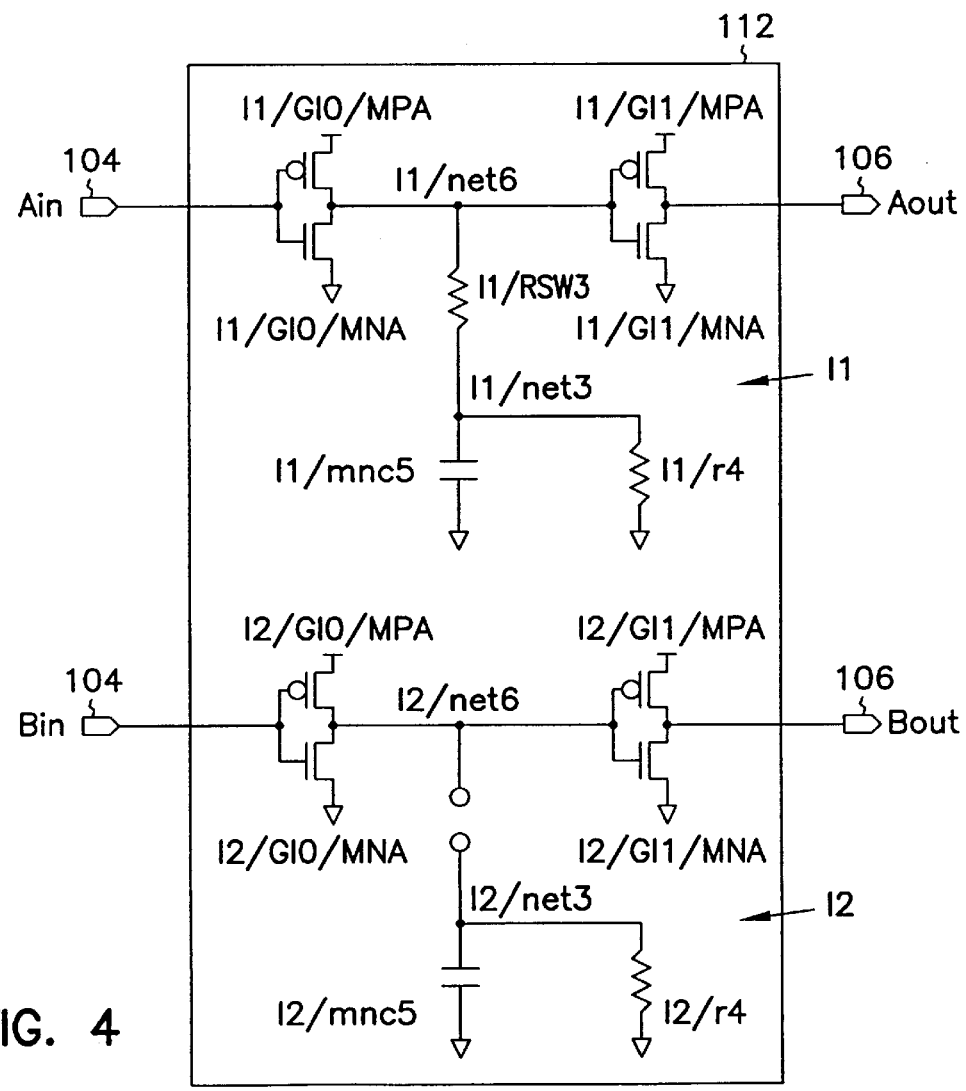
FIG. 4 is a schematic representing the information provided in a flat netlist.

Digressing, as is known in the art, the name of all of the instances and of all of the nets are uniquely identified by the CAD software that is used to produce the schematic. Typically, this unique identification is provided by preceding the name of each instance with the name of the instance that contains it, separated by a slash. Thus, for the two inverters GI0 and GI1 in schematic 102 of FIG. 1, the devices of these inverters are identified as I1/GI0/MPA and I1/GI0/MNA for instance GI0 and as I1/GI1/MPA and I1/GI1/MNA for instance GI1 of instance I1 (FIG. 4). Other devices of instance I1 and devices of instance I2 are designated in a similar manner.

The schematic 102 of FIG. 1 represents one level of hierarchy of design. The schematic 112 of FIG. 3 represents a higher level of hierarchy and for purposes of this description is referred to as a circuit "top". For purposes of this description, the schematic 102 is referred to as a circuit "bottom". A flattened representation of schematic 112 is shown in FIG. 4. It is pointed out that FIG. 4 is presented to aid in the understanding the difference between hierarchical and flat netlists and that the schematic of FIG. 4 would not actually exist as a legitimate representation of the schematic shown in FIG. 3.

Switch Parameter

Referring to FIG. 1, the switch function provided by the invention is accomplished by the use of a parameter. Parameters are data structures supported by Design Entry and other CAD software systems. A parameter for an instance symbol or net consists of a parameter name and a value to be associated with the parameter. Cell C1 has a parameter "position" for switch RSW3. The "open" or "closed" condition for switch RSW3 is indicated on the interpreted value of the instance parameter "position". The parameter "position" has three possible values: "0", "1", and "iPar(control)". The parameter values "0" and "1" represent the current level or local mode in which the switch parameter is evaluated at the bottom level, whereas the parameter "iPar(control)" represents an inherited or hierarchical mode in which the switch parameter is evaluated at the next level up in hierarchy. If the parameter "position" evaluates to 0, the switch is interpreted as being closed. Otherwise, the switch is interpreted as being open.

In the exemplary embodiment, the switch RSW3 has the parameter "position" which has a value "iPar(control)". The parameter "control" has the value "pPar(variable1)". For switch RSW3, the presence of the parameter "control" on the schematic 102 indicates that the condition of the switch RSW3 is unspecified at the bottom level and the value ppar(variable1) represents that the parameter is "passed" to and evaluated at a higher level in the hierarchy as will be described.

Digressing, there are many ways to pass parameters. In one embodiment, the native parameter passing environment used is known as Cadence Expression Language (CEL). There are two commonly used functions, namely, "iPar()" and "pPar()". Function "iPar()" passes parameters locally. The function "iPar(x)" means obtain the value of the parameter "x" from the current instance. For example, if the value of the parameter "position" on a switch RSW3 is set to "iPar(control)", then the value of the parameter "position" receives the value of the parameter "control" on the switch RSW3. If the value of the parameter "control" on the switch RSW3 is "0", then the switch RSW3 is interpreted as being closed. Otherwise, the switch RSW3 is interpreted as being open.

The function "pPar()" passes parameters through hierarchy. The function "pPar(x)" means obtain the value of the parameter "x" from the parent schematic. For example, if the parameter "position" is set to "iPar(control)" and the parameter "control" is set to "pPar(variable1)", then the parameter "position" receives the value of "variable1" found on the parent schematic. In the embodiment shown in FIG. 1 for switch RSW3, the value of the parameter "position" is "pPar(variable1)".

A circuit designer can evaluate a parameter of each switch contained within any block of the schematic 102, including block C1. Referring to FIG. 3, the parameter "position" for the two switches RSW3 for instances I1 and I2 of cell C1 are evaluated at this level in the hierarchy. For instance I1 of cell C1, "variable1" is set equal to "0" (switch in the closed position) and for instance I2 of cell C1, "variable1" is set equal to "1" (switch in the open position).

Flat Netlist

To be useful to a simulator software package, schematic 112, must be translated into a textual netlist file which is a textual coded description of all primitive elements in a schematic and how these elements are connected by nets. This translation is done by a translation program, called a netlister. There are two types of netlists, a hierarchical netlist and a flat netlist. A simulator will read one or both kinds of netlist. A hierarchical netlist includes definitions of primitive and sub-circuit elements, such as are illustrated in FIG. 3, and specifies the nets which interconnect the elements. A flat netlist is essentially the same thing as a hierarchical netlist except that all hierarchical levels have been flattened to their constituent parts.

The implementations discussed herein therefore describe the code to generate the proper simulator-specific netlist representation of a switch. The two simulators to be discussed hereafter are the well known HSPICE simulator which is available from MetaSoft and the DIVA LVS simulator available from Cadence. Though other simulators can be supported, their netlist representations are variations of one of the two simulators referenced herein. The completed flat netlist can be fed at input to a simulator in step for simulation purposes.

Referring now to FIGS. 5A and 5B, there is illustrated a flat netlist 502 for the schematic 112. The flat netlist 502 of FIGS. 5A and 5B is a representation of the instances and nets necessary to describe the schematic 112 to the simulator HSPICE. The flat netlist 502 can be produced from the schematic using the tool Flat Netlister (FNL). The skeleton program of FNL is commercially available from Cadence Design Systems, Inc., San Jose, Calif., as part of their "Open Simulation System" environment. However, other netlisters can be used. The skeleton program FNL allows the easy integration of client-written subroutines to perform output formatting. In one embodiment of the present invention, the process for providing switches in an integrated circuit design is implemented as a set of interfaced subroutines to the skeleton program FNL.

The flat netlist 502 describes the instances and nets specified in a design in a format that is useable by a simulator. In schematic 112, nets can be referenced with string names or not referenced at all. The FNL, however, assigns each net a distinct net number. Therefore, common nets from schematic 112 are given the same net number. In accordance with the invention, each switch appears as an instance on the netlist 502. The switch affects simulation behavior by how it is represented in a netlist which a simulator reads.

In this embodiment of a flat netlist 502, each line in FIGS. 5A and 5B has a number from 1 to 39 preceded by the "5.". The following description is correlated with the line numbers for each line in FIGS. 5A and 5B. In this embodiment of a netlist, all comments are preceded by an asterisk (*).

Referring to FIG. 5A, in the flat netlist 502, comment lines 5.1 to 5.4 specify the assignments for global power supply voltages vpp!, vcc!, vbb! and ground (gnd!) for schematic 112 as being respective nets net 3, net2, net 1, and net 0. The concept of global nets is well known in the art.

Referring additionally to FIG. 3 and to FIG. 4, which is a flattened schematic that represents the information found in the flat netlist 502 of FIG. 5A, lines 5.5 to 5.8 specify the assignment of net numbers 4, 5, 6 and 7 to respective ports Aout, Bout, Bin, and Ain of the schematic 112. Lines 5.12 and 5.13 define capacitor mnc5 of instance I2. The letter "n" indicates the capacitor is formed by an n-type mosfet having its source connected to net 0 (gnd!), its gate connected to net 10 (net3), its drain connected to net 0 (gnd!) and its substrate connected to net 1 (vbb!) as is stated in line 5.13.

Line 5.9 shows that net 9 has been assigned to net6 of instance I2. Line 5.10 shows that net number "10" has been assigned to net3 of instance I2. Similarly, line 5.24, FIG. 5B, shows that net number net 24 has been assigned to net6 of instance I1 and line 5.25 shows that net number net 25 has been assigned to net3 of instance I1.

Lines 5.14 and 5.15 define resistor r4 of instance I2 as being connected between net 0 (gnd!) and net 10 (net3) as stated in line 5.15. Lines 5.16 to 5.23 define the transistors GI1/MNA, GI1/MPA, GI0/MNA and GI0/MPA of instance I2. For example, line 5.17 states that tansistor /I2/GI1/MNA, identified as M3 in line 5.17, is an n-type mosfet, having its drain connected to net 5 (Bout), its gate connected to net 9 (/I2/net6), its source connected to net 0 (gnd!), and its substrate connected to net 1 (vbb!). Transistors GI1/MPA, GI0/MNA and GI0/MPA of instance I2 are defined in a similar manner in lines 5.18 to 5.23.

Referring to FIG. 5B, lines 5.28 and 5.29 are similar to lines 5.12 and 5.13 and define capacitor mnc5 of instance I1. Lines 5.30 and 5.31 are similar to lines 5.14 and 5.15 and define resistor r4 of instance I1 in the manner described above for instance I2. Likewise, lines 5.32 to 5.39 define transistors GI1/MNA, GI1/MPA, GI0/MNA and GI0/MPA of instance I1 in the manner described for instance I2 in lines 5.16 to 5.23.

Referring additionally to FIG. 5A, line 5.11 declares a switch(0) which is the switch RSW3 for instance I2. In the exemplary embodiment, the position of switch /I2/RSW3 is indicated as open. Line 5.26 declares a switch (7) which is the switch RSW3 for instance I1. In the exemplary embodiment, the position of switch /I1/RSW3 is indicated as closed and accordingly, a resistance is provided between the nets. This condition is stated in line 5.27, which calls for a resistance R7 connected between nets 25 (/I1/net3) and 24 (/I1/net6) and having a value of R=0.1 ohms. In the exemplary embodiment, the interconnectivity of a pair of nets associated with the instance of the switch RSW3 can be modified using a device, such as a resistance, such device being used to interconnect the net pair for indicating one state of connected behavior for an instance, and such device being omitted so that the net pair are not interconnected, for indicating a different state of connected behavior for the instance. Also, although the device is embodied as a small resistance, the device can be any device that is capable of effectively shorting together a pair of nets. For example, the device could be a metal element formed on the substrate on which the circuit represented by the schematic is manufactured. Moreover, the interconnectivity of net pairs can be modified by merging a pair of nets which are to be shorted together. For example, such net pairs can be merged by running the netlist created through a post processor which declares only one net for each net pair. Also, such net pairs can be tracked during the creation of the netlist and passing the netlisting data through a filter when the netlist creation function is complete.

It is pointed out that the invention adds line 5.27 to the flat netlist 502 and that other than this line, and comment lines 5.11 and 5.26, the exemplary flat netlist is conventional. The switch condition is represented in the database as a closed condition or an open condition. The switch function according to the invention does not change the connectivity of the database. Rather, the netlister interprets the parameters on a switch at netlisting time to put the appropriate connectivity into the netlist. This enables the appropriate input to be supplied to the appropriate simulator.

Computer System

Figure 6:
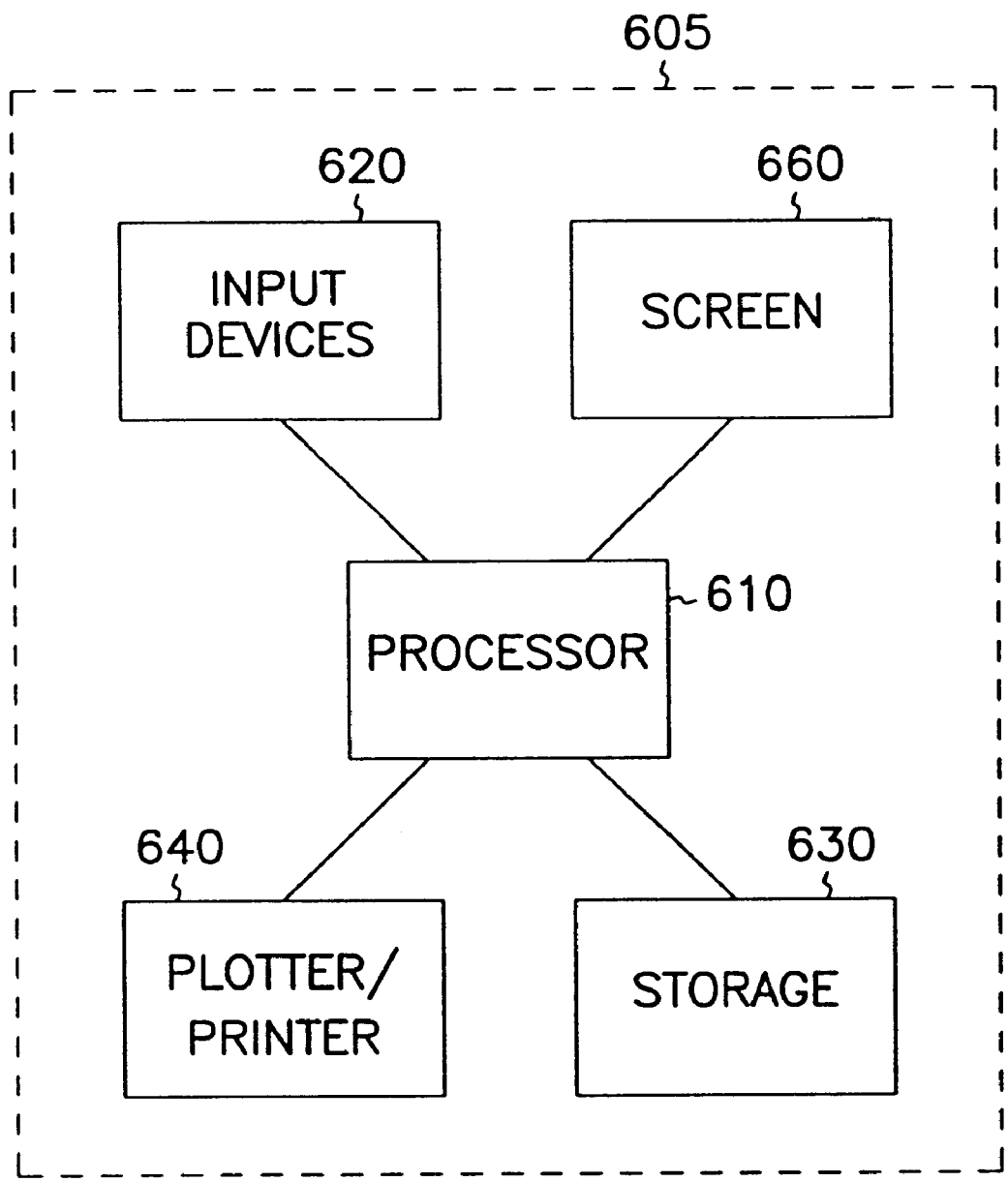
FIG. 6 is a block diagram of a computer system for creating schematic designs and for building netlists.

Referring now to FIG. 6, there is shown a block diagram of a computer system 605 in which the present invention is capable of being executed. A processor 610 is connected to input devices 620, such as a keyboard, mouse or digital drawing pad. Processor 610 is also connected to storage devices 630, printer or plotter 640 and a display unit including a display screen 660. Computer system 605 can be an engineering workstation available from Sun Microsystems in Palo Alto, Calif. Typically, such a workstation is connected to a local area network which provides access to storage devices 630 and has Ethernet connections to the printer 640.

Figure 7:
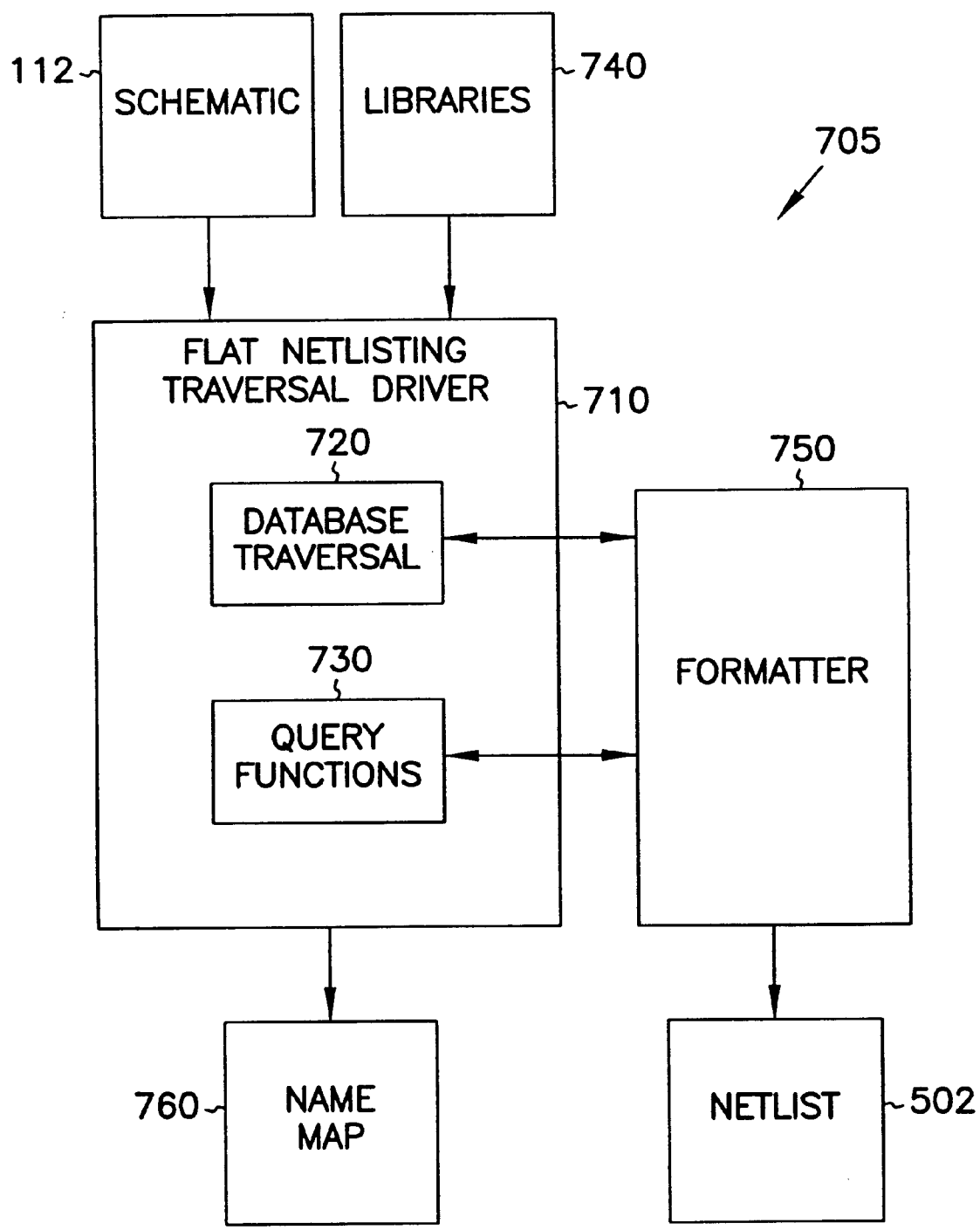
FIG. 7 is a block diagram showing a known flat netlisting driver and the flat netlist formatter provided by the invention.

FIG. 7 is a block diagram of a flat netlister engine 705 for producing the flat netlist 502 in accordance with the invention. The flat netlister engine 705 includes a conventional flat netlisting traversal driver 710 including a database traversal block 720 and query functions 730. The database traversal block 720 walks through the designed schematic's hierarchy of symbol instances and nets to determine the primitive devices for each instance on the schematic 112 and converts the symbol instances from schematic 112 into the appropriate identifiers for the netlist 502. The flat netlisting traversal driver 710 reads libraries 740 allowing the flat netlisting traversal driver to define the most primitive level for the devices that comprise each instance on the schematic. The query functions 730 are used in the creation of the flat netlist 502.

The flat netlister engine 705 further includes a flat netlist formatter 750, provided by the invention, which supplies user-supplied functions to the flat netlisting traversal driver 710 in creating flat netlists, such as flat netlist 502 in accordance with the invention. The user-supplied functions include the function "MSfnSwitchElementString" which is called by "NLPCompleteElementString". The flat netlisting traversal driver produces a name map 760 which aids in post-simulation highlighting within a schematic as is known in the art.

The flat netlister engine 705, including the flat netlisting traversal driver 710 and the flat netlist formatter 750, can be software programs residing in computer system 605, or any other suitable media or computer program product which is capable of providing a computer readable program code. In one embodiment, flat netlisting traversal driver 710 and the user-supplied functions which comprise the flat netlist formatter 750 can be written in SKILL code, a computer language provided by Cadence Design Systems, Inc., San Jose, Calif. In other embodiments, other computer languages, such as C++, Pascal, and SmallTalk computer languages could be used as well.

Figure 8:
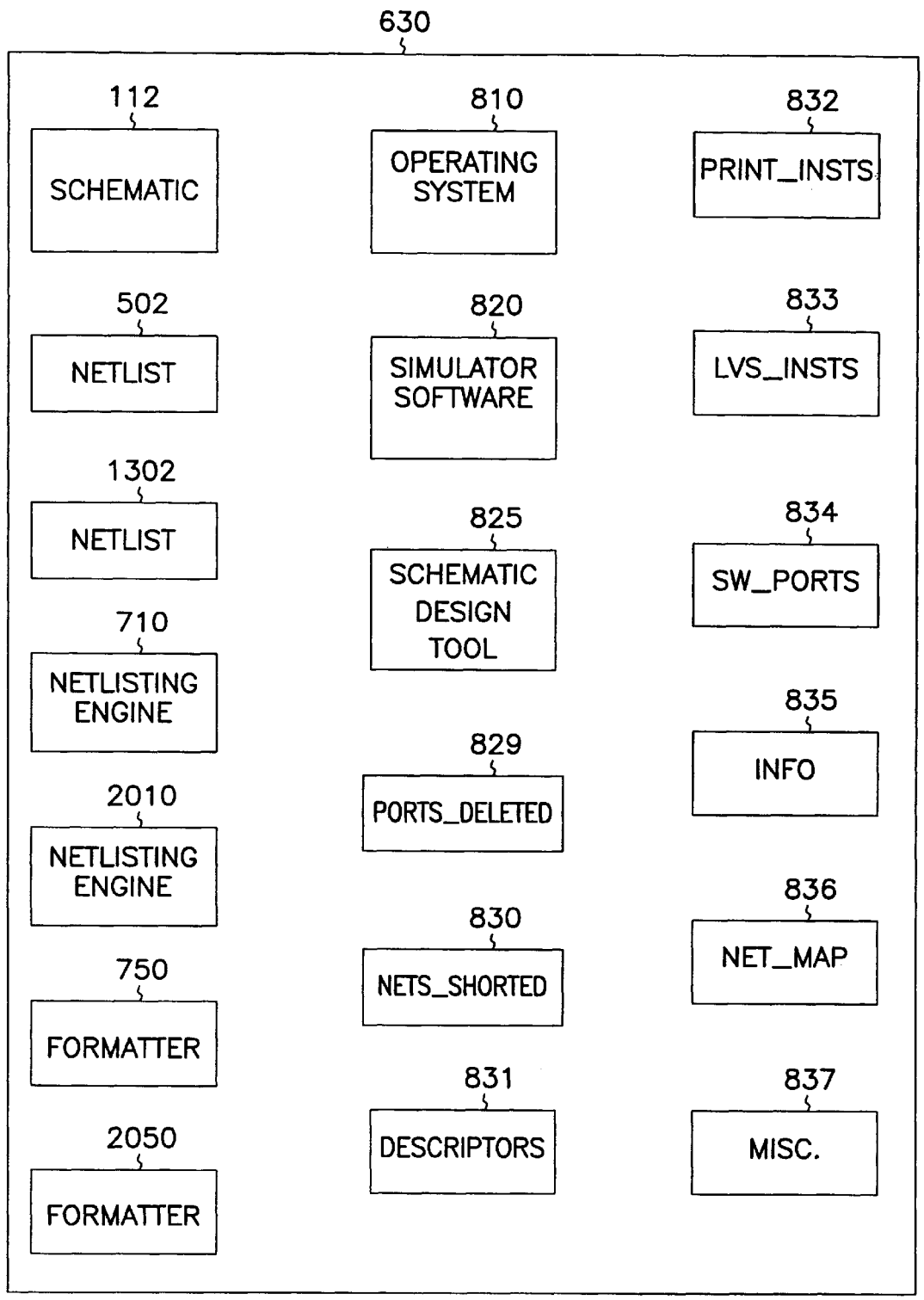
FIG. 8 is a block diagram showing the programs and data in memory and storage of the computer system and which are used in the schematic design, the netlist creation and the simulation of the circuit.

FIG. 8 is a block diagram showing programs, data and files which comprise the storage devices 630 of the computer system 605 and which are used in the schematic design, the netlist creation and simulation of the circuit. The programs, data and files of the computer system 605 include the schematic 112, the flat netlister engine, including the flat netlisting traversal driver 710 and the flat netlist formatter 750, an operating system 810, simulator software 820, a schematic design tool 825, the flat netlist 502, a list PORTS_DELETED 829, a look-up structure. NETS_SHORTED 830, a list DESCRIPTORS 831, a list PRINT_INSTS 832, a list LVS_INSTS 833, a list SW_PORTS 834, a look-up structure INFO 835, and a look-up structure NET_MAP 836. The storage devices 630 also include data storage locations MISC 837 for storing miscellaneous data, including temporarily stored data.

Flat Netlist Creation

Figure 9:
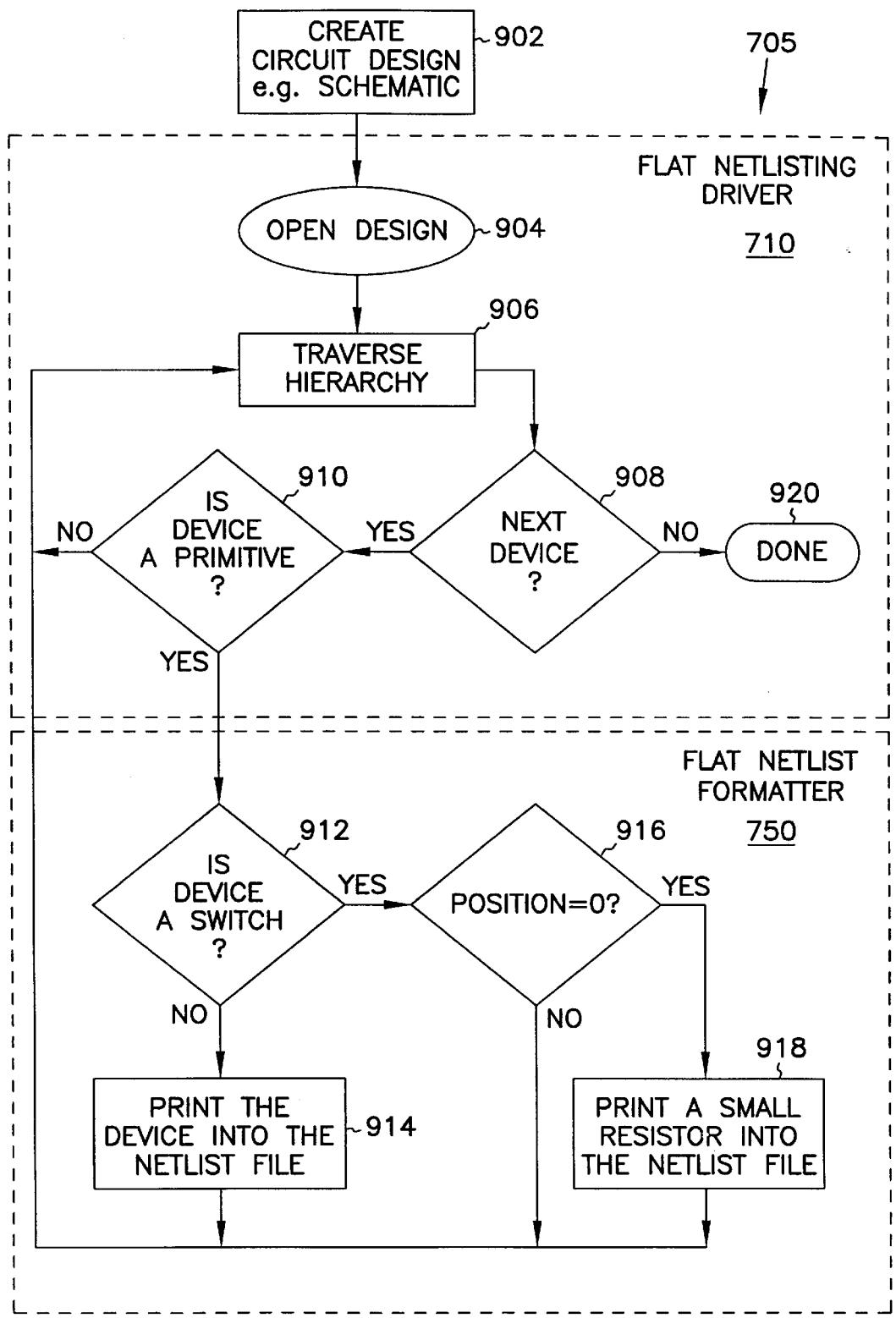
FIG. 9 is a flow chart illustrating the steps taken by the flat netlisting engine and the flat netlist formatter in the creation of the flat netlist provided by the invention.

The following description illustrates the implementation of the invention in creating the flat netlist 502. For the flat netlister, the Cadence software evaluates all hierarchical parameters in the manner known in the art, and delivers the information as if the design were flat. Thus, the properties on each instance are immediately available. The process of circuit designing and netlisting is abbreviated in the flowchart of FIG. 9. FIG. 9 illustrates the processing done by flat netlister engine 705 (FIG. 7) in the creation of the flat netlist 502.

Referring to FIG. 9, in conjunction with FIG. 7, the schematic 112 is created by a CAD system, at step 902, using the schematic design tool 825 (FIG. 8), such as the referenced Cadence ANALOG ARTIST design tool. At step 904, flat netlisting traversal driver 710 opens the file for schematic 112 and traverses the hierarchy of the schematic 112 at step 906 to locate each instance of each device on the schematic, step 908. The flat netlisting traversal driver 710 uses the schematic 112 to create the flat netlist 502. The flat netlisting traversal driver 710 automatically interprets the parameters in the process of flattening the instances in the higher level circuits of the schematic.

If step 910 determines that the current instance is not a primitive device, the procedure loops back to block 906 and continues traversing the hierarchy by descending into the current instance. When step locates a primitive instance of a device, the flat netlisting traversal driver 710, passes control to the flat netlist formatter 750 at step 912, via function "NLPCompleteElementString", to execute a user-provided function.

The procedure is entered at step 912 when a new instance is located by the flat netlisting engine. If step 912 identifies the device as a switch, then at step 916, the parameter "position" is evaluated. The following description assumes that the simulator being used is the simulator HSPICE. In the formatter 750, in the case of a switch, formatting control is passed to "MSfnSwitchElementString". The procedure is entered at step 916 when an instance of a switch, such as switch /I1/RSW3 in instance I1, is encountered. In the exemplary embodiment, the resistor added to the netlist file 502 at step 918 has a value of 0.1 ohms, causing a string to be printed to the netlist file 502 at line 5.27 (FIG. 5B), including "R7", terminal nets, "24" (/I1/net6) and "25" (/I1/net3), and the value of the resistance represented by "R=0.1". This information (i.e., R7 25 24 R=0.1) follows the comment "*switch(7)=/I1/RSW3" that is contained in line 5.26 of the flat netlist 502 shown in FIG. 5B. Control is returned to the flat netlisting traversal driver at step 906 to continue traversing the hierarchy for the next instance.

If, at step 916, the parameter "position" evaluates to something other than "0", then procedure returns to step 906 and nothing is printed to the netlist file 502, Note, a comment "* switch(0)=/I2/RSW3", is added for indicating the presence of a switch (see line 5.11 of the flat netlist 502 shown in FIG. 5A). Thus, upon reading the netlist 502, the absence of anything following such comment is indicative of an open condition for such switch, such as is the case for switch /I2/RSW3 of instance I2. The functions of the netlist formatter 750 control how a switch is written to the flat netlist 502.

When step 908 determines that all devices in the schematic 112 have been evaluated, the procedure is done and exits at step 920. An exemplary code segment for the simulator HSPICE is shown in FIG. 10.

Figure 11:
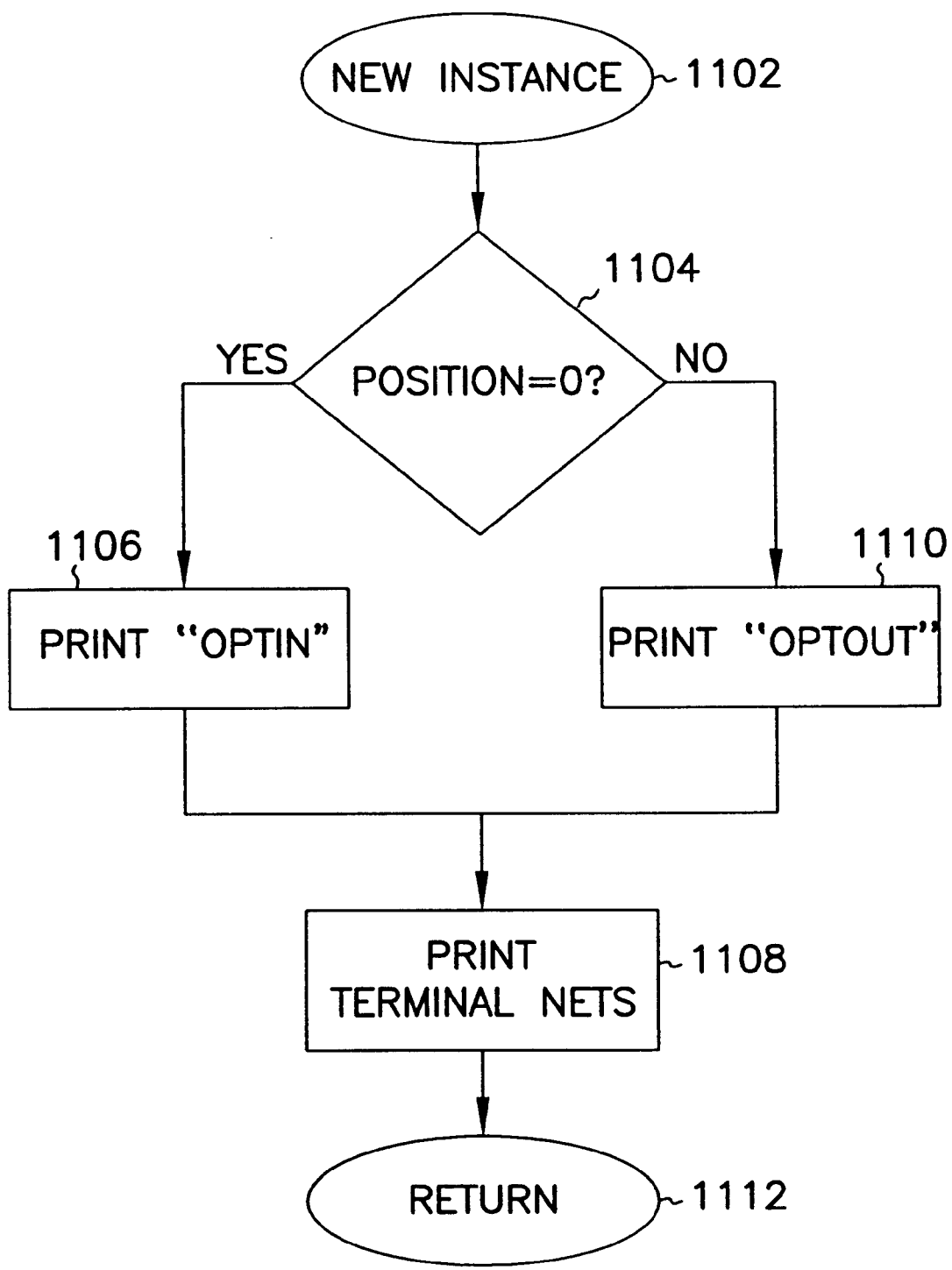
FIG. 11 is a flow chart illustrating a switch specific procedure "MSfnSwitchElementString" for the DIVA LVS simulator.

The process is similar when the netlist is being created for use by the simulator DIVA LVS. In the case of switch RSW3, formatting control is passed to the procedure "MSfnSwitchElementString". FIG. 11 shows one implementation of the procedure "MSfnSwitchElementString" for the simulator DIVA LVS.

Referring to FIGS. 9 and 11, the procedure is entered at step 916 when an instance of a primitive device is encountered at step 912 (FIG. 9) and is determined to be a switch (step 912), such as switch /I1/RSW3 in instance I1. If, at step 1104, the parameter "position" evaluates to "0", then step 1106 prints "optin" in the netlist. Otherwise "optout" is printed in the netlist at step 1110. In either case, at step 1108, the terminal nets, "24" (/I1/net6) and "25" (/I1/net3), in the example, are printed in the netlist. Control is returned to the flat netlisting traversal driver 710 at step 906 (FIG. 9).

The flat netlist for the simulator DIVA LVS is similar to that shown in FIGS. 5A and 5B for the simulator HSPICE as will be apparent to one skilled in the art, except for the statements "optin" and "optout". The following example illustrates the portion of the flat netlist for the simulator DIVA LVS, corresponding to lines 5.26 and 5.27 of the flat netlist 502 shown in FIG. 5B for the simulator HSPICE, when the parameter "position" evaluates to "0":

```
; switch(7) = /I1/RSW3
i 7 optin 25 24
```

If the parameter "position" evaluates to something other than 0, then the device is written to the flat netlist as "optout." An example is shown below:

```
; switch(0) = /I2/RSW3
i 0 optout 9 10
```

An exemplary segment of code from the procedure illustrated in FIG. 11 is shown in FIG. 12.

Hierarchical Representation of the Schematic

The foregoing description has shown how the invention represents a switch in a flat netlist. The following description will show how the invention represents a switch in a hierarchical netlist, such as netlist 1302 shown in FIG. 13. This is accomplished according to the invention by declaring local nets of a sub-circuit of a schematic as "artificial" ports, when needed. At the next level in the hierarchy, "artificial" nets are declared, providing a mechanism for connecting an added element, such as a small resistance or any other device that can effectively short together a pair of nets, to the sub-circuit at a level in the hierarchy above the level at which the switch is declared. The small resistance essentially shorts the two nets that the switch is adjacent to. It is pointed out that "artificial" ports and "artificial" nets are not declared when real ports and nets exist.

Although the device that is used to "short" a pair of nets is embodied as a resistance, the device can be any device that is capable of effectively shorting together a pair of nets. For example, the device could be a metal element formed on the substrate on which the circuit represented by the schematic is manufactured. Moreover, the interconnectivity of net pairs can be modified by merging a pair of nets which are to be shorted together as will be described. By way of example, such net pairs can be merged by running the netlist created through a post processor which declares only one net for each net pair. Also, such net pairs can be tracked during the creation of the netlist and passing the netlisting data through a filter when the netlist creation function is complete.

Figure 15:
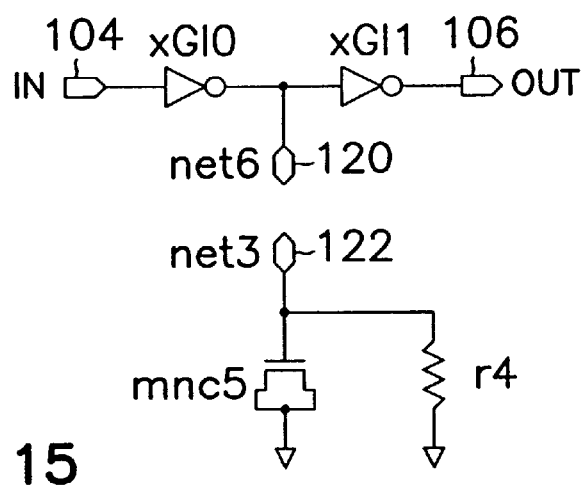
FIG. 15 is a hierarchical representation of the schematic of FIG. 1.
Figure 16:
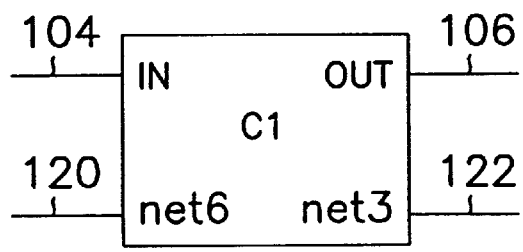
FIG. 16 is a hierarchical representation of the symbol of FIG. 2 and illustrating artificial ports created in accordance with the invention.

More specifically with reference to FIGS. 16 and 17, in implementing the "switch function" to cell C1, the present invention defines "artificial" ports and "artificial" nets for the cell C1. FIG. 16 shows a possible symbolic representation of the cell C1 with the nets, namely net3 and net6, designated as "artificial" ports. The "artificial" ports, which are created, are designated as 120 and 122 in FIG. 15. As shown in FIG. 17, "artificial" net 1720, which has the identification "I1__net6", is connected to "artificial" port net6 of instance xi1. "Artificial" net 1722, which has the identification "I1__net3" is connected to "artificial" port net3 of instance xi1. The "artificial" ports net6 and net3 of instance xi1, together with the "artificial" nets "I1__net6" and "I1__net3", provide a mechanism for connecting a small resistor, given the reference designation "rmsil__0", between the two nets net6 and net3 of schematic 102 (FIG. 15), effectively shorting together net6 and net3 so that capacitor mnc5 and resistor r4 are connected to net6 (FIG. 15). The switch RSW3 is represented in FIG. 1 by a dashed box drawn around the "artificial" port 120 and "artificial" port 122. Note that instance xi2 has no resistor connecting I2__net6 and I2__net3. Thus, net6 and net3 of instance xi2 are not connected together.

Figure 18:
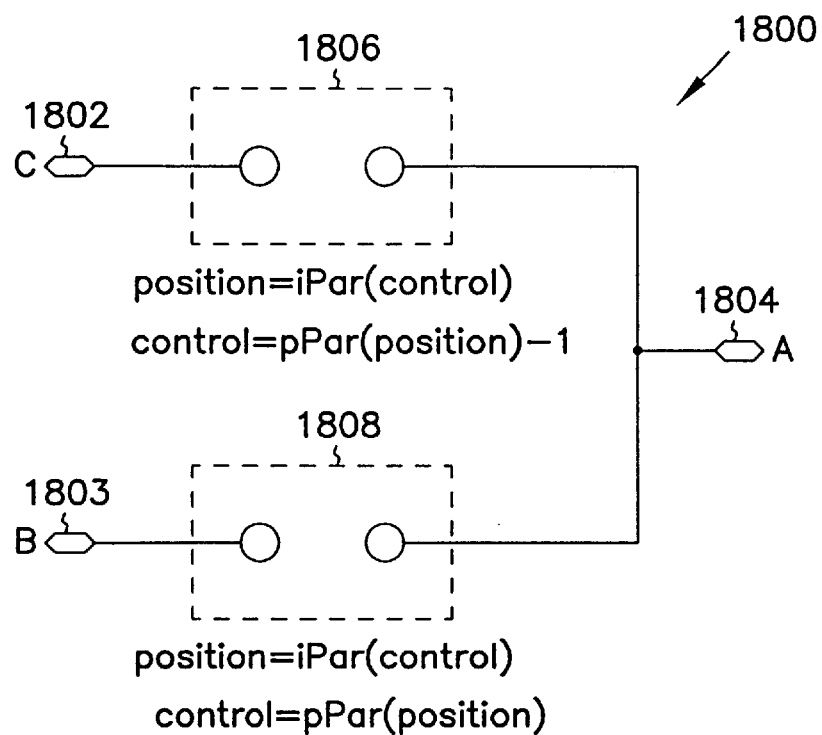
FIG. 18 is a schematic for a two-position switch that can be implemented using the switch function in accordance with the invention.
Figure 19:
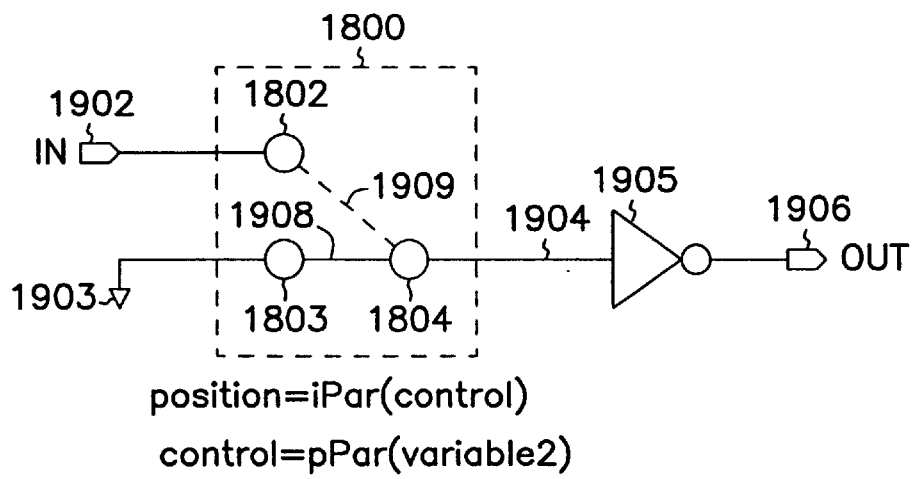
FIG. 19 is a schematic with an instance of the two-position switch of FIG. 18.

Digressing, referring to FIGS. 18 and 19, there is illustrated another example of an application of the switch provided by the invention. FIG. 18 is a schematic for a two-position switch 1800 that can be implemented using the switch function in accordance with the invention. The two-position switch 1800 can have a first evaluation for which the switch provides a connection between terminals 1802 and 1804 of the switch or a second evaluation for which the switch provides a circuit path between terminals 1803 and 1804 of the switch. The switch has a parameter "position" which is equal to "iPar(control)". The parameter "control" is equal to "pPar(position)−1" for switch 1806. The parameter "control" is equal to "pPar(position)" for switch 1808.

FIG. 19 is a schematic with an instance of the two-position switch 1800 of FIG. 18. The two-position switch is interposed between an input pin 1902, a ground connection pin 1903 and an input 1904 of an inverter 1905 the output of which is connected to an output pin 1906. The two-position switch is used to provide a connection between the input pin 1902, or ground at pin 1903, and the input of the inverter 1905. For the instance of the switch 1800 in FIG. 19, the parameter "position" is equal to "iPar(control)". and the parameter "control" is equal to "pPar(variable2)", allowing the parameter "position" to be evaluated at a level of the hierarchy above that at which the instance of switch 1800 is defined.

The switch symbol can have a wiper arm. When the value of "position" is "0", the wiper arm would be in the horizontal position, connecting the ground connected pin 1903 to the input of the inverter 1905, as represented by the solid line 1908. When the value of "position" is "1", the wiper arm is in the diagonal position, connecting the input pin 1902 to the input of the inverter 1905, as represented by the dashed line 1909.

In the present example, the value of "position" is "iPar (control), illustrated in FIG. 19, the wiper arm would not be visible and a label would be applied in place of the wiper arm, the label displaying the evaluated value of "position", i.e., "1" or "0". The value of position is evaluated by the CAD tool that is being used to create the schematic. All levels or hierarchy are interpreted in the evaluation. By way of example, one suitable CAD tool is ANALOG ARTIST design tool available from Cadence Design Systems, Inc., San Jose, Calif.

In the case of FIG. 18, it is noted that all of the switch terminals are already connected to ports. Therefore, no artificial ports are created. Rather the existing ports are used for connecting a shorting device into the circuit. Although a two-position switch has been shown in FIGS. 18 and 19, the same principle can be applied to provide a three-position switch, a four-position switch, etc.

Hierarchical Netlist

Reference is now made to FIG. 13, which is a hierarchical netlist 1302 of the schematic 112 of FIG. 3. The hierarchical netlist 1302 represents instances and nets necessary to describe the schematic 112 for each hierarchical level in a design and is specific to the simulator HSPICE. The hierarchical netlist 1302 is produced by a netlisting tool which reads a representation of a design and converts the information to a textual file in a format specific to a particular simulator.

Referring to FIG. 13, the syntax of the hierarchical netlist 1302 is formatted in a manner that the simulator HSPICE can interpret. Each line in FIG. 13 has a number from 1 to 20 preceded by the "13.", for FIG. 13. The following description is correlated with the line numbers for each line in FIG. 13. In this embodiment of a netlist, all comments begin with an asterisk (*).

Line 13.1 declares that nets vcc and gnd are common to all sub-circuits within the design and can be accessed anywhere within the netlist 1302. Any net that is not declared in the ".GLOBAL" statement is considered to be local.

Figure 14:
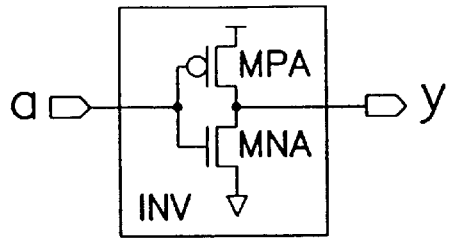
FIG. 14 is a schematic representing the inverters of the schematic of FIG. 1.

Lines 13.3 to 13.7 describe the circuit of "inv". The schematic for "inv" is shown in FIG. 14. Referring additionally to FIG. 14, the circuit of "inv" includes a p-type mosfet MPA and an n-type mosfet MNA which have their gates commonly connected to a port "a" and their drains commonly connected to a port "y". The sources of MPA and MNA are connected to vcc! and gnd!, respectively. Line 13.4 declares a sub-circuit called "inv" having two ports "a" and "y". Line 13.5 declares an instance of MNA. The first letter "M" specifies the device is a transistor. The string "MNA" is the instance name within the schematic of the sub-circuit "inv". As shown in FIG. 14, the drain of the transistor MNA is connected to the port "y" (y is declared a port in line 13.4). The gate of the transistor MNA is connected to the port "a". The source of the transistor MNA is connected to the global net "gnd". The transistor is lying in a substrate that is connected to "gnd". The model used for simulating this transistor is "N". The length of the transistor is dependent on the value of the parameter "lnA" on the instance of "inv" at the next level of hierarchy (refer to lines 13.13 and 13.14). The width of the transistor is dependent on the value of the parameter "wnA" on the instance of "inv" at the next level of hierarchy (refer to lines 13.13 and 13.14). Line 13.6 is similar to line 13.5, but declares an instance of the p-type mosfet MPA. Line 13.7 indicates that the description of the sub-circuit "inv" is finished.

Lines 13.9 to 13.15 describe the circuit called "bottom" which corresponds to FIG. 1. Referring to FIG. 15, which illustrates what is being described in the netlist 1302, line 13.10 declares the sub-circuit called "bottom" having four ports "in", "out", "net3," and "net6". Notice that in FIG. 1 the only real ports for this circuit are "in" and "out". The other ports "net3" and "net6" can be considered "artificial" ports. The switch "RSW3" in FIG. 1 is replaced by the "artificial" ports "net3" and "net6" as shown in FIG. 15. FIG. 16 shows a possible symbolic representation of cell C1 with the added "artificial" ports net3 and net6. These "artificial" ports provide a mechanism for connecting a small resistor between the two nets, "net3" and "net6", of cell C1, essentially shorting together the nets, providing the function of a closed switch.

Line 13.11 declares an instance of resistor r4. The first character "r" means the instance is a resistor. The name of the instance is "r4". One terminal or net of the resistor is connected to the global net "gnd". The other terminal or net of the resistor is connected to the net "net3". The resistance "R" of the resistor is 100K ohms.

Line 13.12 declares an instance of an n-type enhancement mosfet which is connected to function as the capacitor mnc5. The source, drain, and substrate of MNA are connected to the global net "gnd". The gate of MNA is connected to the net identified as "net3". The parameters of the mosfet are specified as length "l" equal to 1 and width "w" equal to 10.

Line 13.13 declares an instance of inverter GI0. The first character "x" indicates the instance is a sub-circuit, which in this case is sub-circuit "inv" declared in line 13.4. The name of the instance is "xGI0". This corresponds to inverter "GI0" in FIG. 1. The string "inv" declares the instance is a placement of the sub-circuit "inv" declared in line 13.4. Port "a" of instance "xGI0" is connected to the port "in" of the sub-circuit called "bottom". Port "y" of instance "xGI0" is connected to the net identified as "net6". The parameter "LnA" for MNA (refer to line 13.5) is 1.0, which is passed through the hierarchy to the n-type mosfet "MNA" within instance "xGI0", making its length "l" equal to 1.0. The parameter "wnA" for MNA (refer to line 13.5) is 10.0. This parameter is passed through the hierarchy to the n-type mosfet "MNA" within instance "xGI0", making its width "w" equal to 10.0. Similarly, the length and width for the p-type transistor "MPA" within "xGI0" are set equal to 1.0 and 15.0 by "LpA" and "wpA" respectively, refer to line 13.6. Line 13.14 declares another instance of "inv". Instance "xGI1", which corresponds to inverter GI1 (FIG. 1), is connected between the net identified as "net6" and the port "out" on the schematic 102 for the circuit called "bottom". Line 13.15 states that the description of the circuit called "bottom" is finished.

Thus, the invention causes nets net6 and net3 to be declared as ports in the description of the circuit called "bottom" in line 13.10 of the hierarchical netlist 1302.

Figure 17A:
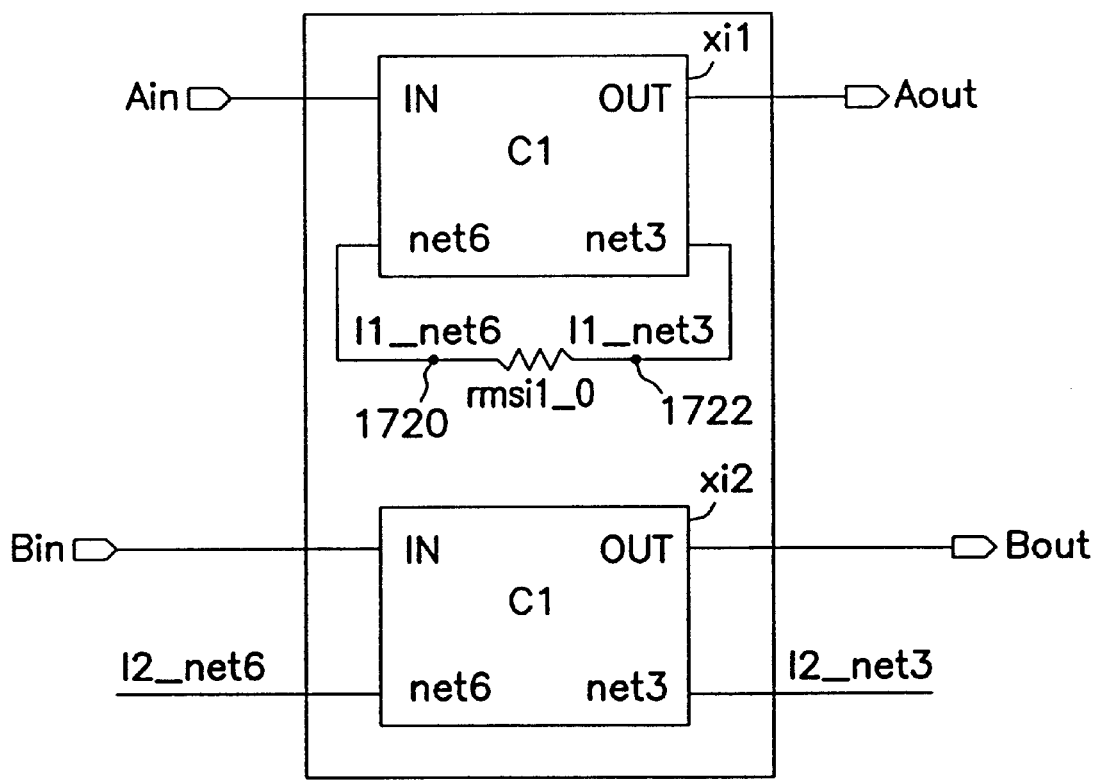
FIG. 17A is a hierarchical representation of the schematic of FIG. 3 wherein nets are interconnected by a resistance.

Lines 13.17 to 13.20 declare the circuit called "top". Because this is the top-level circuit, no ports are declared as in lines 13.4 and 13.10. The circuit "top" is shown in FIG. 3. FIG. 17A illustrates what is described in the hierarchical netlist 1302.

Line 13.18 declares an instance of the circuit called "bottom". The name of the instance is "xi1". Referring additionally to line 13.10, the port "in" of "xi1" is connected to the net "Ain". The port "out" of "xi1" is connected to the net "Aout". The "artificial" port "net3" of "xi1" is connected to the "artificial" net "I1__net3". The "artificial" port "net6" of "xi1" is connected to the "artificial" net "I1__net6".

Line 13.19 declares an instance of a resistor "rmsi1__0" with a resistance value of 0.1 ohms connected between the "artificial" nets "I1__net3" and "I1__net6". The small resistance represents a short. Notice that there is actually no resistor in FIG. 3. Also, there is no net called "I1__net3" and there is no net called "I1__net6". Thus, the nets "I1__net3" and "I1__net6" also are "artificial" nets. FIG. 17A shows the resistor "rmsi1__0" and the "artificial" nets "I1__net3" and "I1__net6" as represented in the netlist 1302.

Line 13.20 declares another instance "xI2" of the sub-circuit "bottom". Notice that there is no resistor connected to the "artificial" ports of this instance as can be seen by referring to FIG. 17A. Thus, line 13.20 of the netlist does not have associated therewith a line corresponding to line 13.19 that is associated with line 13.18.

Hierarchical Netlist Creation

Figure 20:
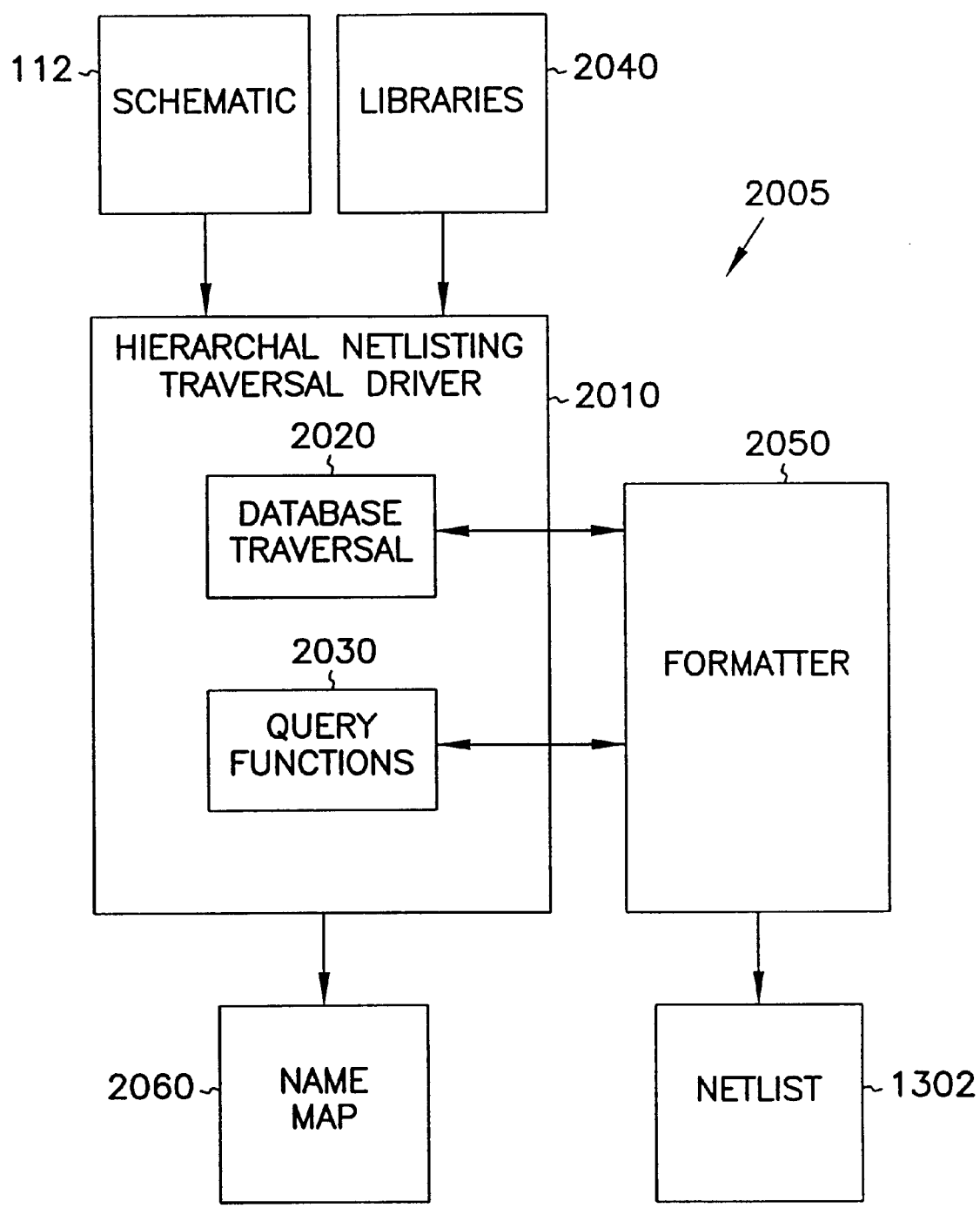
FIG. 20 is a block showing a known hierarchical netlisting engine and the hierarchical netlist formatter provided by the invention.

Referring to FIG. 20, the following description illustrates the implementation of a switch in a hierarchical netlist. FIG. 20 is a block diagram of a hierarchical netlister engine 2005, which includes a conventional hierarchical netlisting driver 2010 and a hierarchical netlist formatter 2050 provided by the invention. The hierarchical netlister engine 2005 is somewhat similar in composition to the flat netlister engine 705 shown in FIG. 7. In one embodiment, the hierarchical netlisting driver 2010 includes a database traversal function 2020 and query functions 2030. The hierarchical netlisting driver 2010 obtains data from schematic 112 and from libraries 2040 and produces a name map 2060. The hierarchical netlist formatter 2050 supplies user-supplied functions to the hierarchical netlisting driver 2010 in creating the hierarchical netlist 1312.

The hierarchical netlisting driver 2010 and the hierarchical netlist formatter 2050 can be software programs residing in computer system 605 or any other suitable media or computer program product which is capable of providing a computer readable program code. In one embodiment, the hierarchical netlister engine 2005, including the hierarchical netlisting driver 2010 and the user-supplied functions of formatter 2050, can be written in SKILL code, a computer language provided by Cadence Design Systems, Inc., San Jose, Calif. In other embodiments, other computer languages, such as C++, Pascal, and SmallTalk computer languages could be used as well. The hierarchical netlisting driver 2010 traverses hierarchy of the schematic 112 to discover all of the instances and nets that specify a design. The schematic 112 is traversed from the bottom level to the top level. The designer controls the information written to the netlist file 1302 by providing functions written, for example, in SKILL code, to the hierarchical netlist formatter 2050.

Figure 21:
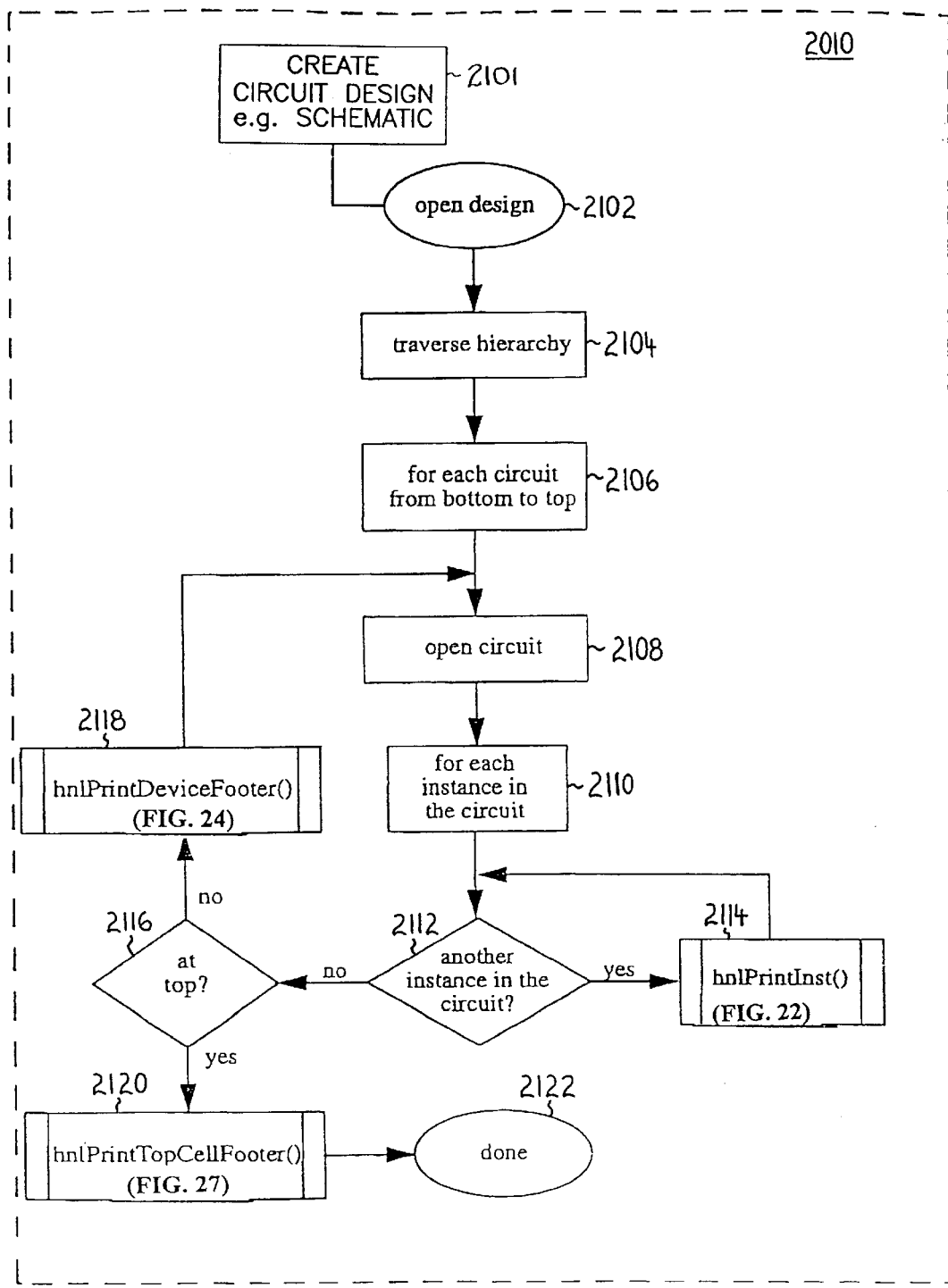
FIG. 21 is a process flow chart illustrating the operation of the hierarchical netlist engine in creating a hierarchical netlist.

FIG. 21 is a process flow chart illustrating the hierarchical netlisting driver 2010 and showing its interface with the hierarchical netlist formatter 2050. The schematic 112 is created by a CAD system at step 2101 using the schematic design tool 825 (FIG. 8). The schematic 112 of the design is opened at step 2102. At step 2104, the hierarchical netlisting driver 2010 traverses the hierarchy and at steps 2106–2108, each circuit of the schematic is delivered from the bottom level to the top level of the hierarchy. At steps 2110–2112, for each instance encountered in the circuit, control is passed at step 2114 to the hierarchical netlist formatter 2050 to deal with the instance, the instance being processed by a segment of user-provided function called "hnlprintinst()" as will be described with reference to FIG. 22. When the current instance has been processed by the hierarchical netlist formatter 2050, step 2208 returns control to the hierarchical netlisting traversal driver 2010 at step 2112 for processing the next instance in the currently opened circuit.

Figure 24:
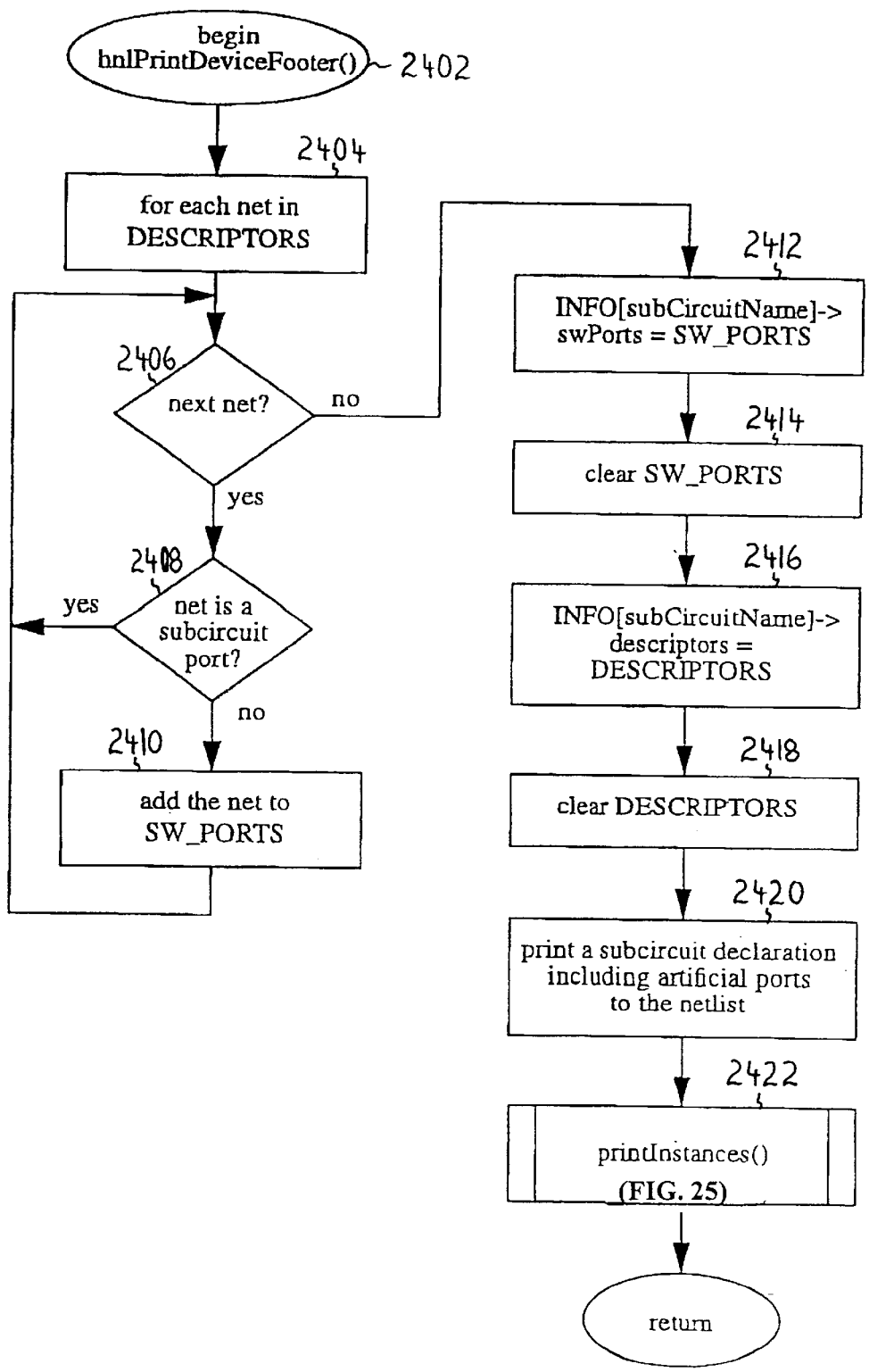
FIG. 24 is a process flow chart illustrating how the hierarchical netlist formatter completes a sub-circuit.
Figure 25:
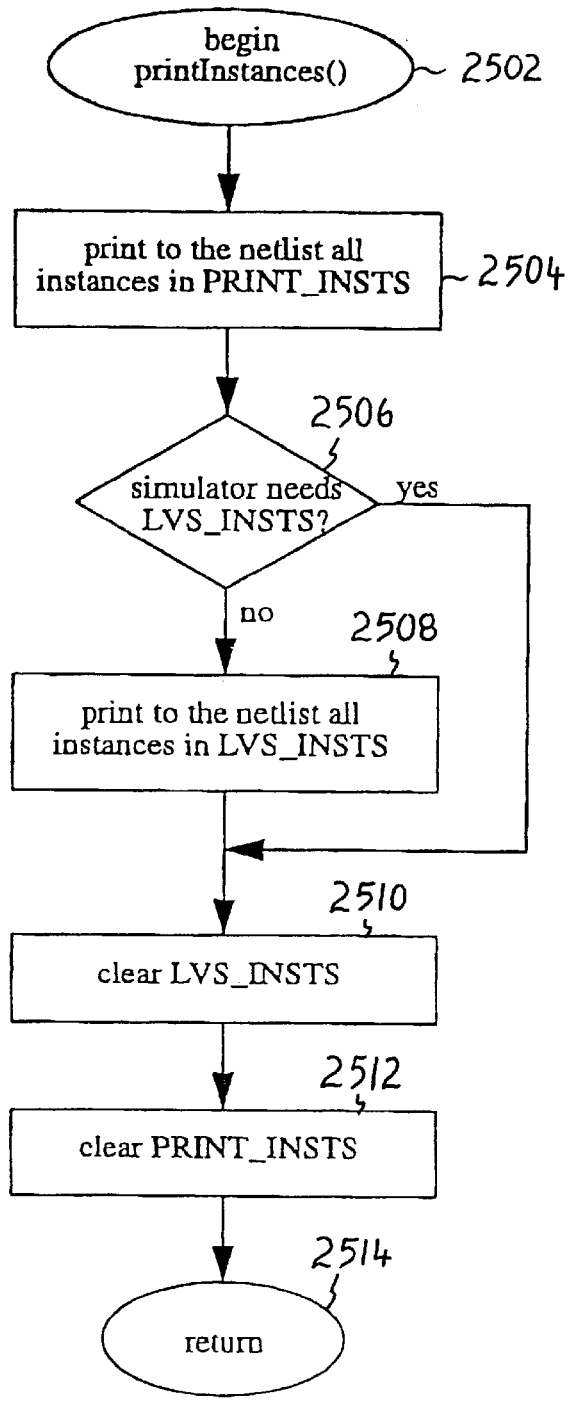
FIG. 25 is a process flow chart illustrating how the hierarchical netlist formatter prints instances in a circuit.

When all instances in the currently opened circuit have been processed, the procedure continues to step 2116 where a determination is made as to whether the sub-circuits at all the levels in the hierarchy, except the top-level circuit, have been processed. If not, control is passed to hierarchical netlist formatter 2050 at step 2118 for completing the sub-circuit using a segment of user-provided function "hnlPrintDeviceFooter()" which will be described with reference to FIG. 24. FIG. 24 is a process flow chart illustrating steps taken by the hierarchical netlist formatter 2050 in completing a sub-circuit. When the sub-circuit is complete, the information describing the instances of the sub-circuit are printed to the netlist file using a segment of user-provided function "printInstances()" which will be described with reference to FIG. 25. FIG. 25 is a process flow chart illustrating how the hierarchical netlist formatter prints instances of a sub-circuit.

Figure 27:
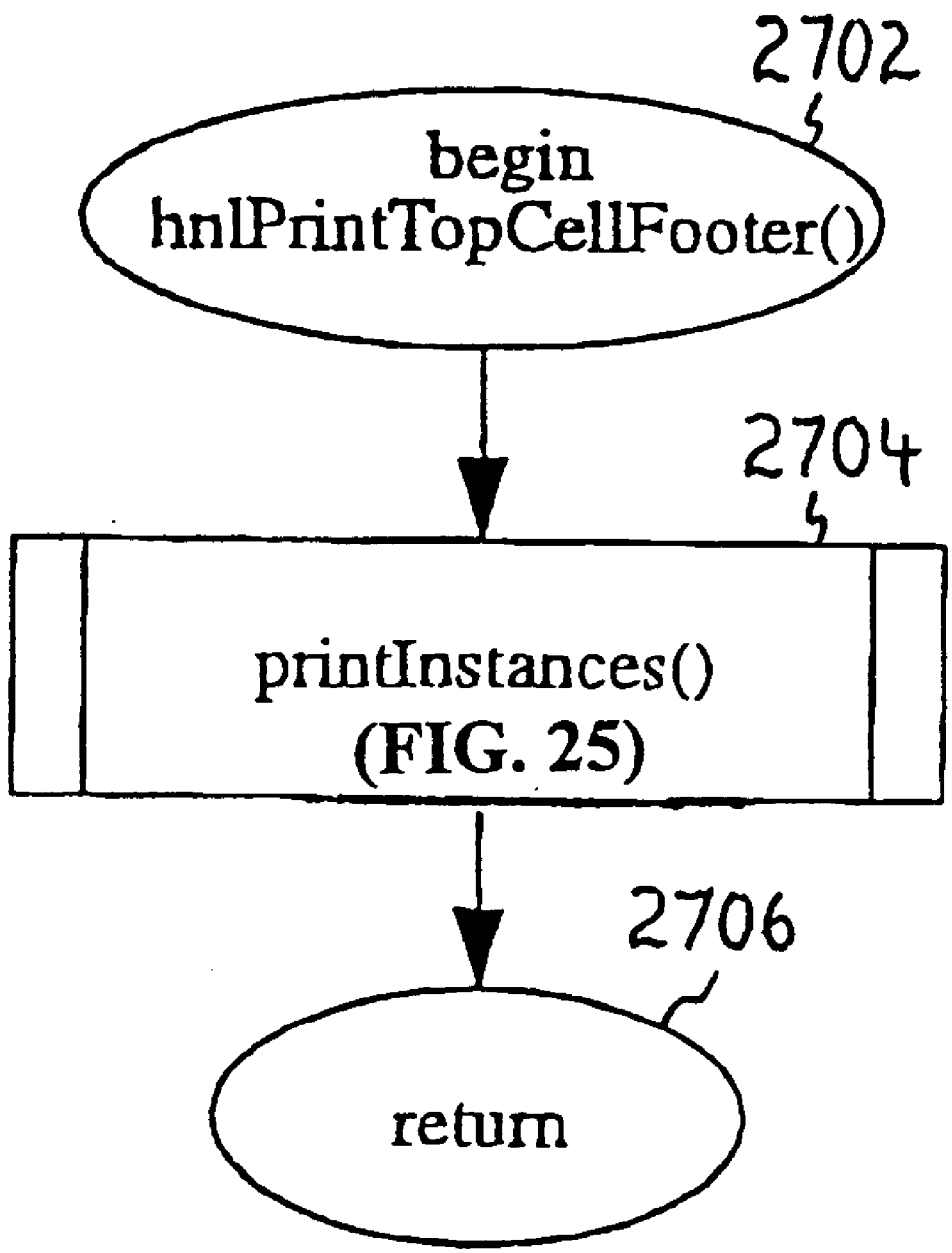
FIG. 27 is a process flow chart illustrating how the hierarchical netlist formatter completes the top of the design.

When all sub-circuits in the hierarchy have been processed, then, at step 2116, control is passed at step 2120 to the hierarchical netlist formatter 2050 for printing to the netlist using a segment of user-provided function called "hnlPrintTopCellFooter()" which will be described with reference to FIG. 27. FIG. 27 is a process flow chart illustrating steps taken by the hierarchical netlist formatter 2050 in printing to the netlist file 1302 when the top of the design is reached. The creation of the hierarchical netlist 1302 is done when the information has been printed to the netlist file.

Figure 22:
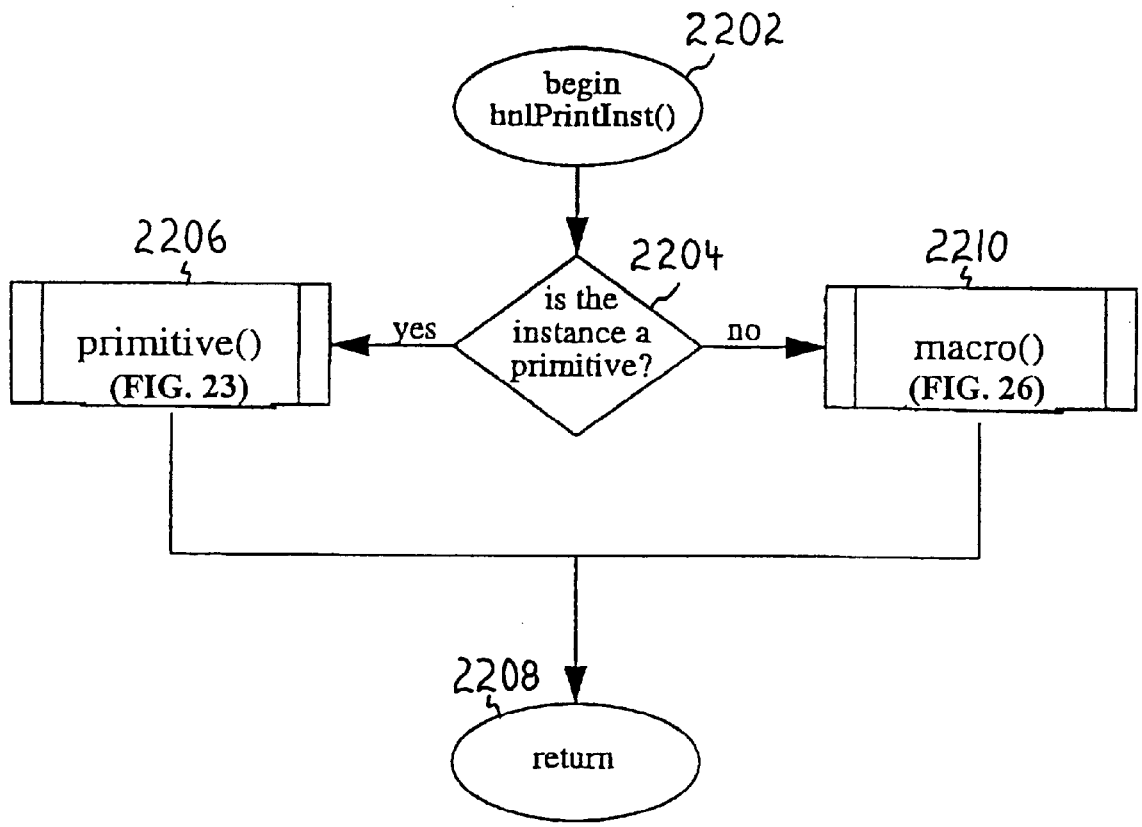
FIG. 22 is a process flow chart illustrating how the hierarchical netlist formatter deals with an instance in a circuit.

For each instance encountered in the circuit, the netlisting engine passes control, at step 2114, to the hierarchical netlist formatter 2050 to deal with the instance, the instance being processed by a segment of user-provided function called "hnlprintInst()". FIG. 22 is a process flow chart illustrating steps taken by the hierarchical netlist formatter 2050 in dealing with an instance.

Figure 23:
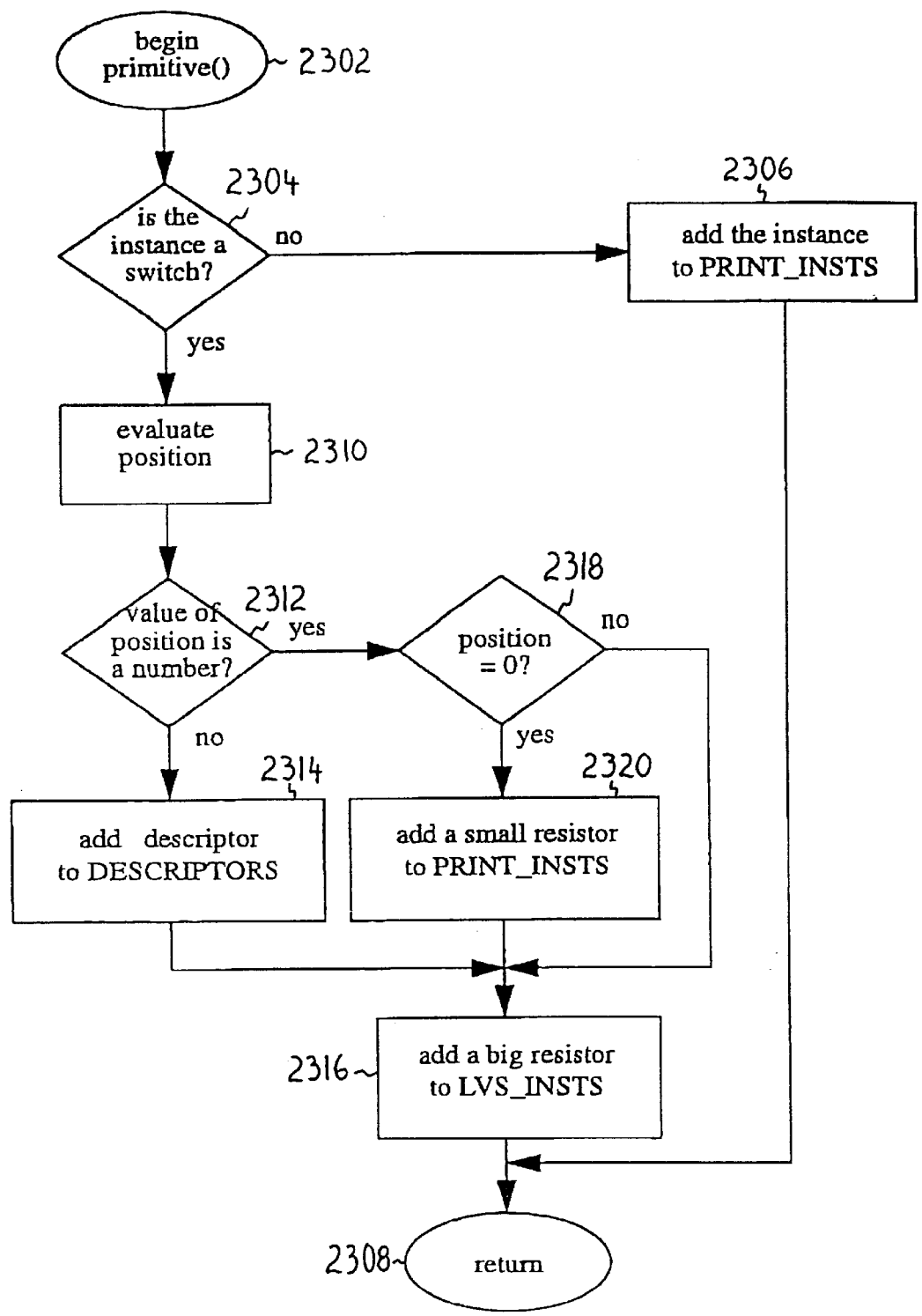
FIG. 23 is a process flow chart illustrating how the hierarchical netlist formatter deals with a primitive instance in a circuit.
Figure 26:
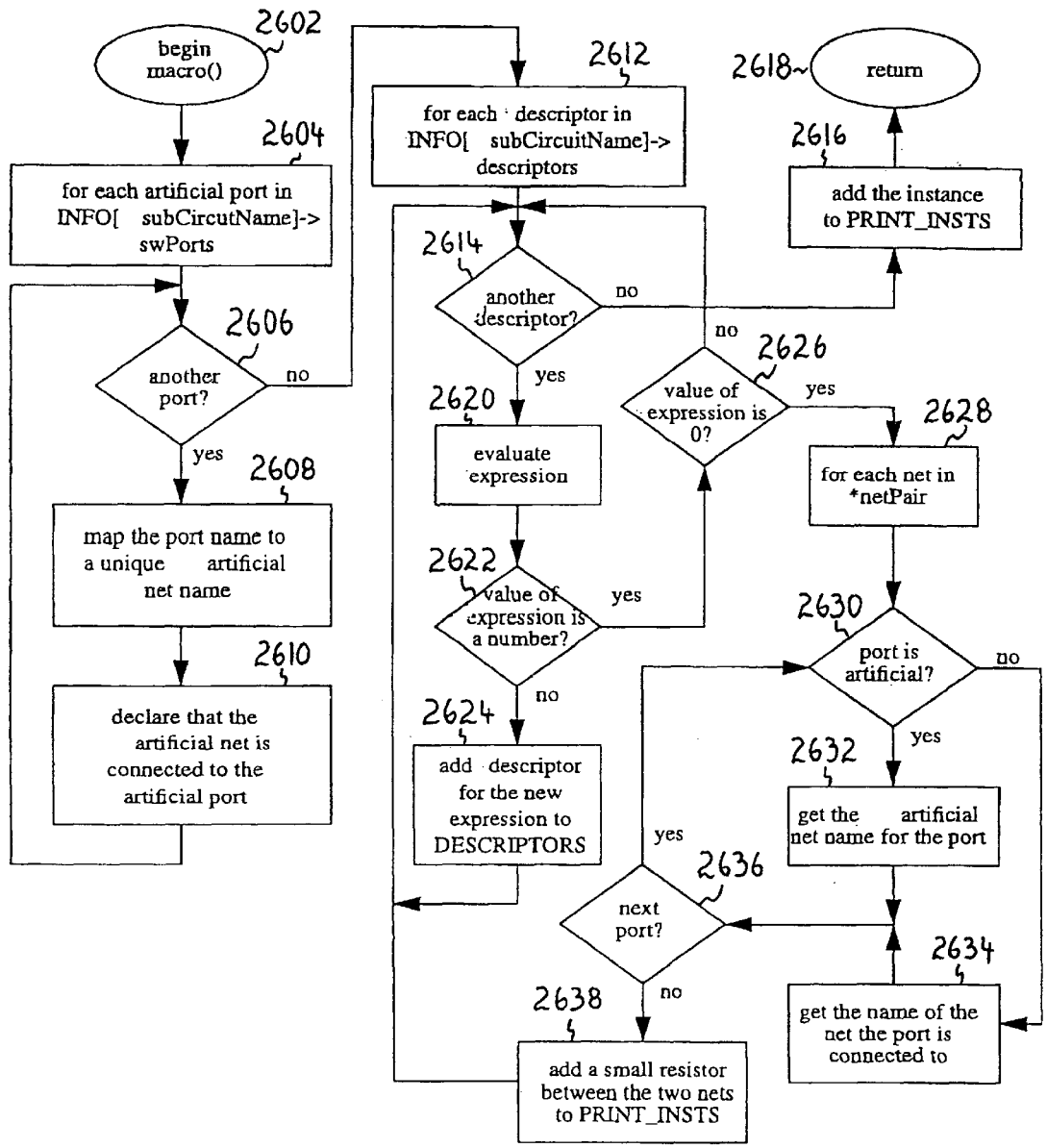
FIG. 26 is a process flow chart illustrating how the hierarchical netlist formatter deals with a sub-circuit instance.

Referring to FIG. 22, a determination is made at step 2204 as to whether or not the current instance is a primitive instance. If so, step 2206 passes control to a user-provided function called "primitive()" which will be described with reference to FIG. 23. FIG. 23 is a process flow chart illustrating steps taken by the hierarchical netlist formatter in dealing with a primitive instance. If, on the other hand, the instance is not a primitive instance, then control is passed at step 2210 to a user-provided function called "macro()" which will be described with reference to FIG. 26. FIG. 26 is a process flow chart illustrating steps taken by the hierarchical netlist formatter in dealing with an instance that is not a primitive instance.

Referring now to FIG. 23, a determination is made at step 2304 as to whether or not the current instance is a switch. If not, then at step 2306, the instance is added to a list PRINT__INSTS 832 (FIG. 8) and at step 2308, control is returned to the Hierarchical netlisting engine 2010 (FIG. 21) to process the next instance. If step 2304 determines that the current instance is an instance of a switch, the parameter "position" is evaluated at step 2310. If step 2312 determines that the value of the parameter "position" is a number, such as "0" or "1", for example, a determination is made at step 2318 as to whether the parameter "position" evaluates to "0". If so, a small resistor is added to the list PRINT__INSTS 832 at step 2320 to represent a closed switch and the procedure continues to step 2316. If the parameter "position" does not evaluate to "0" at step 2318, the procedure loops directly to step 2316. At step 2316, a large resistance is added to the list LVS_INSTS 833 for use by any simulator that needs a representation of an open switch. Then, control is returned to the hierarchical netlisting driver 2010 at step 2308.

If step 2312 determines that the value of the parameter "position" is not a number, then at step 2314, a "descriptor" is added to a list DESCRIPTORS 831 FIG. 8) to permit the parameter to be evaluated at a higher level of hierarchy.

Digressing, in the exemplary embodiment, a descriptor has three elements. The first element is an expression to be evaluated at the next level of hierarchy. In the exemplary embodiment, the expression is the value of "position". By way of illustration, if position is "pPar(x)−1+pPar(y)", then it evaluates to "x−1+y", so "x−1+y" is the expression. In the exemplary embodiment, the expression is "variable1". The second element of the descriptor is a list of parameters to be interpreted at the next level of hierarchy. By way of illustration, if position evaluates to "x−1+y", then the list of parameters is (x y). In the exemplary embodiment, the list of parameters is (variable1). The third element of the descriptor is a list of the two nets in a sub-circuit to be connected at the next level of hierarchy by a small resistor if the expression evaluates to zero. These nets are considered as ports at the next level of hierarchy. In the exemplary embodiment, the two nets are net3 and net6.

Referring again to FIG. 23, after the descriptor has been added to the list, the procedure at step 2316 adds a large resistor to list LVS_INSTS 833. Then, control is returned to the hierarchical netlisting driver 2010 at step 2308 to process the next instance. FIGS. 28A and 28B are a listing of an exemplary code segment for dealing with a primary instance in accordance with the process of FIG. 23. In this embodiment of a code segment, all comments begin with a semicolon (;).

Referring now to FIG. 24, the procedure "hnlPrintDeviceFooter()" begins at step 2402. At steps 2404–2406, each net in the list DESCRIPTORS 831 is evaluated. At step 2408, a determination is made as to whether the nets are ports of the sub-circuit port. If so, the procedure loops back to step 2406. If not, the nets are declared to be "artificial" ports and so the "artificial" ports are added to the list SW_PORTS 834 (FIG. 8) at step 2410.

When step 2406 determines that all ports in the list DESCRIPTORS 831 have been processed, the procedure continues to step 2412 where the "artificial" switch ports that are contained in the list SW_PORTS 834 are added to the look-up structure INFO[subCircuitName] 835 (FIG. 8). Then, at step 2414, the list SW_PORTS 834 is cleared for the next cell. Step 2416 adds the descriptors contained in the list DESCRIPTORS 831 to the look-up structure INFO [subCircuitName] 835. Step 2418 clears the list DESCRIPTORS 831 is cleared for the next cell.

At step 2420, a sub-circuit declaration, including real and "artificial" ports is printed to the netlist file 1302 and the procedure steps to step 2422 which calls the procedure "printInstances()", illustrated in FIG. 25, which prints all instances in the list 832 for the current sub-circuit to the netlist file. The PRINT_INSTS list 832 contains all the necessary information required to print an instance to the netlist file, i.e., the instance ports, the nets that the instance ports are connected to, device parameters, etc. FIG. 30 is a listing of an exemplary code segment for completing a sub-circuit in accordance with the process of FIG. 24. In this embodiment of a code segment, all comments begin with a semicolon (;).

Referring to FIG. 25, the procedure "printInstances()" is entered at step 2502. Step 2504 prints to the netlist all instances in the list PRINT_INSTS 832. Step 2506, determines if the simulator being used requires the information in the list LVS_INSTS 833, and if so, step 2508 prints all instances in the list LVS_INSTS 833 to the netlist. Step 2510 clears the list LVS_INSTS 833. The procedure continues directly from step 2506 to step 2510 if it is determined that the simulator does not need the information contained in the list LVS_INSTS 833. The procedure continues and step 2512 clears the list PRINT_INSTS 832. Control is returned to the netlisting engine 2010 at step 2514.

Referring now to FIG. 26, in dealing with a sub-circuit instance, such as the instance GI0 of the inverter, that is not primitive, the procedure uses a segment of user-provided function called "macro()" which begins at step 2602. At steps 2604–2606, a look-up structure called INFO [subCircuitName] 835 is accessed to determine the artificial ports for the cell name. The properties of the look-up structure INFO[subCircuitName] 835 are accessed with "→swPorts", i.e., "swPorts" accesses the "artificial" ports for "subCircuitName", the term "subCircuitName" being the name of the sub-circuit that is represented by the instance. For example, one sub-circuit is the circuit C1 called "bottom"; INFO["bottom"]→SwPorts returns ("net3" "net6"). For each port that is an artificial port, step 2608 maps the port name to a unique "artificial" net name in a look-up structure NET_MAP 836 (FIG. 8). As has been indicated, the creation of "artificial" nets provides a way for connecting a small resistor (simulating a closed switch) between nets in a sub-circuit instance, the nets being declared as "artificial" ports. At step 2610, the "artificial" net is declared as being connected to the "artificial" port. The procedure loops back to step 2606 to map any other "artificial" ports in the current instance to an "artificial" net name.

When all of the "artificial" ports in the current instance have been mapped to "artificial" nets, then at steps 2612–2614, for each descriptor in the look-up structure INFO[subCircuitName] 835, the expression is evaluated at step 2620, and a determination is made at step 2622 as to whether the value of the expression is a number. If not, the descriptor for the new expression is added to the list DESCRIPTORS 831 at step 2624, and the procedure loops back to step 2614.

If the expression is a number, a determination is made at step 2626 as to whether the expression evaluates to "0". If not, the procedure loops back to step 2614 to process the next descriptor. Otherwise, at steps 2628–2630, a determination is made for each net of the netpair of the descriptor being processed as to whether the port is an "artificial" port. If so, step 2632 gets the "artificial" net name for the port from the look-up structure NET_MAP 836. After both of the nets of the current switch descriptor have been processed at step 2636, a small resistor is added between the two nets to the PRINT_INSTS 832 list at step 2638. Then, the procedure loops back to step 2614 and processes the next descriptor, if there is another descriptor for the current instance. If step 2630 determines that the port being processed is not an artificial port, the procedure gets the name of the net that the port is connected to, step 2634, and continues to step 2636.

When all of the descriptors have been evaluated as determined by step 2614, the macro instance is added to the list PRINT_INSTS 832 at step 2616, and control is returned to the hierarchical netlist driver 2010 at step 2618. FIGS. 29A and 29B are a listing of an exemplary code segment for dealing with a sub-circuit instance in accordance with the process of FIG. 26. In this embodiment of a code segment, all comments begin with a semicolon (;).

Referring now to FIG. 27, when all of the instances in the top level schematic have been processed, the code segment hnlPrintTopCellFooter() is called by the netlisting engine 2010 and begins at step 2702. Step 2704 calls the function printInstances(), the process flow chart for which is shown in FIG. 25, to print all the instances of the top-level schematic.

To illustrate the creation of the hierarchical netlist 1302, specific reference is made to the exemplary circuit called "top", shown in FIG. 3, and initially to the process flow charts of FIGS. 21 and 22. The hierarchical netlisting driver 2010 opens the schematic 112 at step 2102 and traverses the entire design tree, determining dependencies at step 2104. Step 2106 delivers "inv" as the first sub-circuit in the hierarchy. Step 2108 opens "inv". Step 2110 delivers each instance in the circuit.

The instance of mosfet MNA within the sub-circuit called "inv", shown in FIG. 14, is delivered at step 2112 and control is passed to the netlist formatter 2050 at step 2114. At step 2204 (FIG. 22), a determination is made as to whether or not the current instance is a primitive. Because the mosfet is a primitive instance, control is passed at step 2206 to the user-provided function "primitive()" which begins at step 2302 in FIG. 23.

Referring to FIG. 23, step 2304 determines that mosfet MNA is not a switch and so step 2306 adds the instance of mosfet MNA to the list PRINT_INSTS 832. Step 2308 returns control to the hierarchical netlisting driver 2010 at step 2112.

The same procedure is carried out for the instance of mosfet MPA within the sub-circuit "inv". After processing the instance of mosfet MPA, control is again returned to step 2112, which determines that all instances of the sub-circuit called "inv" have been processed. At step 2116, the procedure continues to step 2118 because the circuit "inv" is not the top level in the hierarchy. Step 2118 causes the netlist formatter 2050 to execute the function "hnlPrintDeviceFooter()", which begins at step 2402 in FIG. 24, for printing the information to the netlist file. In this example, the information that is printed to the netlist file is the information that is contained in lines 13.3 to 13.7 of the netlist 1302 shown in FIG. 13.

More specifically, with reference to FIG. 24, at steps 2404–2406, the list DESCRIPTORS is empty and so flow continues to 2412. The list SW_PORTS is empty so an empty list is stored in the look-up structure INFO["inv"]. The list SW_PORTS is cleared at step 2414. Step 2416 stores the empty list DESCRIPTORS to the lookup structure INFO["inv"]. Step 2418 clears the list DESCRIPTORS. Step 2420 prints a sub-circuit declaration to the netlist file as line 13.4 of FIG. 13. Then, step 2422 calls the function printInstances(), as shown in FIG. 25.

Referring to FIG. 25, the function "printInstances()" begins at step 2502 and at step 2504 prints all of the instances contained in the list PRINT_INSTS to the netlist 1302. This appears as lines 13.5 and 13.6 in the netlist 1302 (FIG. 13). If the netlist were being created for a simulator that needs information about open switches, the information stored in the list LVS_INSTS would be printed to the netlist at step 2508. Note that for the sub-circuit "inv", the list LVS_INSTS is empty. Step 2510 clears the list LVS_INSTS. Step 2512 clears the list PRINT_INSTS.

Referring additionally to FIGS. 21 and 25, at step 2514, control is returned to the hierarchical netlisting driver 2010 to open the next circuit (step 2108) which is the circuit called "bottom", shown in FIG. 1. The instance GI0 of "inv" is delivered at step 2112 and the procedure continues to step 2114 which calls the function "hnlPrintInst()" which begins at step 2202 in FIG. 22. Step 2204 determines that "inv", the current instance, is not a primitive device and so step 2210 calls the function "macro()" for processing the sub-circuit instance in accordance with the procedure illustrated in FIG. 26.

Referring now to FIG. 26, the procedure begins at step 2602 and steps 2604–2606, determine that there are no "artificial" ports for the instance GI0 of the inverter, and so the procedure continues to step 2612. Steps 2612 and 2614 determine that the instance GI0 of "inv" does not have any descriptors in the look-up structure INFO["inv"] 835. The procedure branches to step 2616 and adds the instance to the list PRINT_INSTS 832. Control is returned to the hierarchical netlisting engine at step 2112 (FIG. 21) to process the next instance, which is the instance GI1 of "inv". This instance is handled in the same manner as instance GI0, resulting in the instance been added to the list PRINT_INSTS 832.

The instance of capacitor mnc5 is delivered at step 2112 and control is passed to the netlist formatter 2050 at step 2114. At step 2204 (FIG. 22), a determination is made as to whether or not the current instance is a primitive instance. Because capacitor mnc5 is a primitive instance, control is passed at step 2206 to the user-provided function "primitive()" which begins at step 2302 in FIG. 23.

Referring to FIG. 23, step 2304 determines that capacitor mnc5 is not a switch and so step 2306 adds the instance of the capacitor mnc5 to the list PRINT_INSTS 832. Step 2308 returns control to the hierarchical netlisting driver 2010 at step 2112 A similar procedure is carried out for the instance of the resistor r4, causing the instance to be added to the list PRINT_INSTS 832.

Referring again to FIG. 23, the procedure is similar for the switch RSW3 up to step 2304 where the instance of the switch RSW3 is encountered. When step 2304 determines that the current instance is a switch, the parameter "position" is evaluated at step 2310. In the example, the value of parameter "position" is "variable1". Accordingly, the procedure advances to step 2314 to add a "descriptor" to the list DESCRIPTORS 831. In the example, the expression element of the descriptor is "variable1", the list of parameters of the descriptor is (variable1), and the netpair element of the descriptor is (net6 net3). Because in this example, the current instance is a switch, a large resistance is added to the list LVS_INSTS 833 at step 2316.

Control is returned to the hierarchical netlisting driver 2010 at step 2112 (FIG. 21) which determines that all instances of the sub-circuit called "bottom" have been processed and flows to step 2116. At step 2116, the procedure continues to step 2118 because the circuit "bottom" is not the top level in the hierarchy. Step 2118 causes the netlist formatter 2050 to execute the function "hnlPrintDeviceFooter()", which begins at step 2402 in FIG. 24, for printing the information to the netlist file. In this example, the information that is printed to the netlist file is the information that is contained in lines 13.9 to 13.15 of the netlist 1302 shown in FIG. 13.

More specifically, with reference to FIG. 24, at steps 2404–2406, the list DESCRIPTORS 831 is accessed to obtain the netPair "net6" and "net3" that are saved in the list and indexed to the sub-circuit "bottom". Step 2408 determines that net6 is not a port of the sub-circuit "bottom" and so "net6" is added to the list SW_PORTS 834 at step 2410. Moreover, step 2408 determines that net3 is not a port of the sub-circuit "bottom" and so "net3" is added to the list SW_PORTS 834 at step 2410. In the example, there are no other nets in the list DESCRIPTORS 831 and so the information contained in the list SW_PORTS 834, namely "net6" and "net3" for sub-circuit "bottom" is stored in the look-up structure INFO, at step 2412, and the list SW_PORTS 834 is cleared at step 2416. Step 2416 stores the elements of the "descriptor" that are applied to the instance of the switch RSW3, namely, the expression "variable1", the list of parameters is (variable1) and the netPair (net6 net3), in the look-up structure INFO. The list DESCRIPTORS 831 is cleared at step 2418. Step 2420 prints a sub-circuit declaration of the sub-circuit "bottom", including the real and artificial ports to the netlist file 1302 as line 13.10 in FIG. 13. Then, step 2422 calls the function printInstances(), is shown in FIG. 25.

Referring to FIG. 25, the function "printInstances()" begins at step 2502 and at step 2504 prints all of the instances contained in the list PRINT_INSTS 832 to the netlist 1302. This will appear as lines 13.11 to 1314 in the netlist 1302 (FIG. 13). If the netlist were being created for a simulator that needs information about open switches, the information stored in the list LVS_INSTS 833 would be printed to the netlist at step 2508. Step 2510 clears the list LVS_INSTS 833. Step 2512 clears the list PRINT_INSTS 832. At step 2514, control is returned to the netlisting engine 2010 to open the next circuit (step 2108, FIG. 21) which is the circuit called "top", which is shown in FIG. 3. The circuit "top" contains instances I1 and I2 of the sub-circuit C1 called "bottom".

Referring to FIGS. 21 and 22, at steps 2110–2112, when the first instance I1 of the circuit "top" is encountered, control is passed to the netlist formatter 2050 at step 2114 to call the procedure "hnlPrintInst()" which begins at step 2202 (FIG. 22). Step 2204 determines that instance I1 is not a primitive instance, and so step 2210 calls the function "macro()" which begins at step 2602 in FIG. 26.

Referring to FIG. 26, at steps 2604–2606, the "artificial" ports net6 and net3 stored in the look-up structure INFO ["bottom"] 835 are obtained. Step 2608 maps each of the port names to a unique "artificial" net name, which are I1_net6 and I1_net3, in the example. Then, step 2610 declares the "artificial" nets I1_net6 and I1_net3 to be connected to the "artificial" ports net6 and net3, respectively. At steps 2612–2614, the descriptor for "bottom" is obtained from the look-up structure INFO["bottom"]. In the example, the descriptor "bottom" includes the parameter "variable1" and the ports net6, net3. At steps 2620–2622, variable1 is evaluated. In the example, variable1 for instance I1 evaluates to "0". Consequently, the process at step 2626 continues to step 2628. Step 2630 determines that "net6" in the net pair is an "artificial" port and so step 2632 gets the "artificial" net name "I1_net6" for the "artificial port" "net6". The procedure is repeated to get the "artificial" net name "I1_net3" for the "artificial" port "net3". Then, step 2638 puts a small resistor between the two "artificial" nets I1_net6 and I1_net3 into the list PRINT_INSTS 832. Note that this will appear on line 13.19 of the netlist 1302 in FIG. 13. The procedure loops back to step 2614 and because there are no more descriptors for the circuit "top", step 2616 puts the instance of "bottom" into the list PRINT_INSTS 832. Step 2618 returns control to the hierarchical netlisting driver 2010 to process instance I2.

The instance I2 is processed in a similar manner up to step 2626. However, because the parameter "variable1" for instance I2 evaluates to "1", from step 2626, the procedure loops back to step 2614 and from there branches to step 2616 to add the instance I2 to the list PRINT_INSTS 832. Control is again returned to the hierarchical netlisting driver 2010 at step 2112 (FIG. 21). Because all instances in the circuit "top" have been processed, the procedure continues to step 2116. Step 2116 determines that this is the top level circuit and proceeds to step 2120 which calls the procedure "hnlPrintTopCellFooter()" (FIG. 27) to print the top cell footer to the netlist file.

Referring to FIG. 27, the function "hnlPrintTopCellFooter ()" begins at step 2702. To print the top cell footer to the netlist file, the procedure "printInstances()", illustrated in FIG. 25, is called at step 2704. Referring to FIG. 25, step 2504 prints to the netlist all instances in the list PRINT_INSTS 832. This will appear as lines 13.18 to 13.20 in the netlist 1302 (FIG. 13). If the netlist were being created for the simulator LVS, the information stored in the list LVS_INSTS 833 would be printed to the netlist at step 2508. Step 2510 clears the list LVS_INSTS 833 and step 2512 clears the list PRINT_INSTS 832. When the top cell footer has been printed to the netlist file, the procedure is done and step 2514 returns control to the netlisting engine 2010 at step 2122 thereof.

Net Merging Procedure

As has been indicated above, the interconnectivity of net pairs can be modified during the creation of a netlist file by merging a pair of nets which are to be shorted together. Thus, in accordance with a further embodiment of the invention, the hierarchical netlist formatter 2050 comprises user-provided functions that cause a pair of nets associated with a switch to be merged, rather than adding a small resistor to the PRINT_INSTS list 832, during the creation of a netlist file. The hierarchical netlist formatter 2050 supplies the further user-provided functions to the hierarchical netlisting driver 2010 in creating a hierarchical netlist.

Figure 17B:
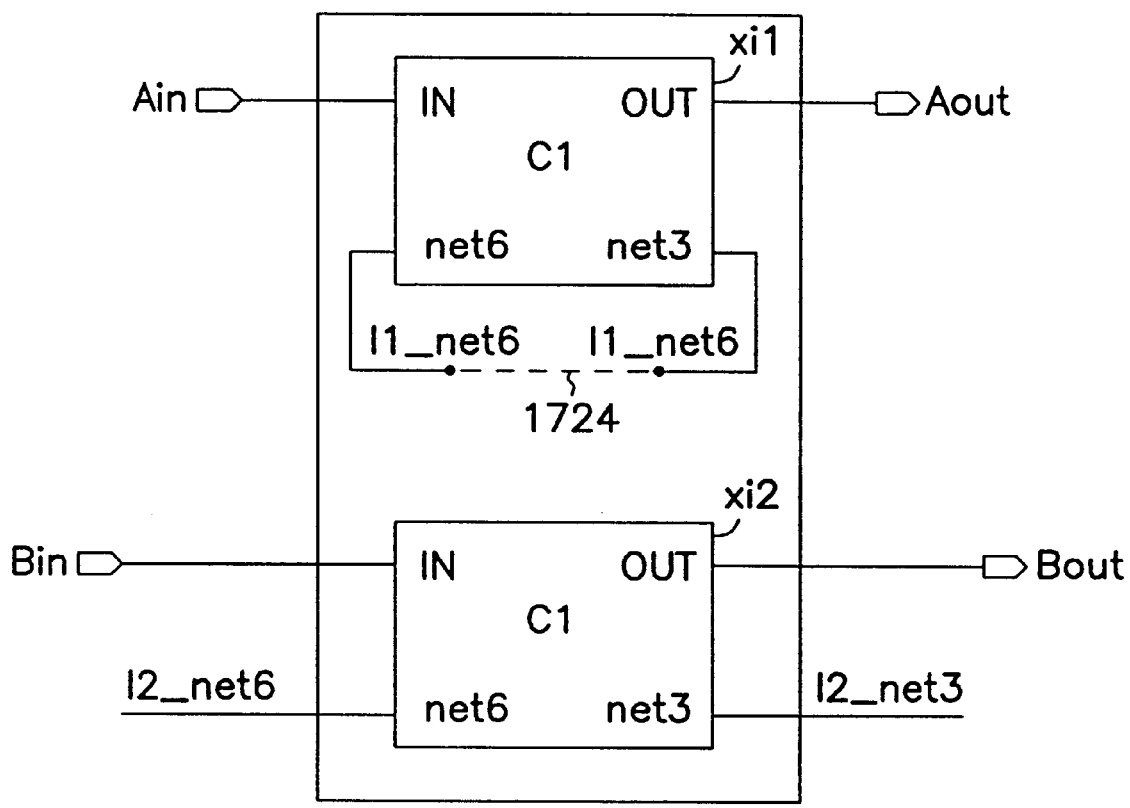
FIG. 17B is a hierarchical representation of the schematic of FIG. 3; wherein nets are merged.

Referring to FIG. 17B, "artificial" nets are created for the two nets, net6 and net3, that are to be shorted together by a switch, such as switch RSW3 (FIG. 1). As will be shown, the procedure merges the artificial nets that are created for net3 and net6 which, in turn, become artificial ports of sub-circuit C1 as has been described above. The artificial nets that are created for net3 and net6 of instance xi1 are "I1_net3" and "I1_net6". The net merging procedure maps one of the artificial nets, such as the artificial net corresponding to net3, into the other net, net6 in this example, and so as illustrated in FIG. 17B, both of the artificial nets are identified by the same net name "I1_net6". This will be reflected in the netlist created for each pair of nets, or combination of nets, that are merged. In FIG. 17B, the switch parameter that interconnects the two nets is represented by the dashed line 1724.

Figure 31:
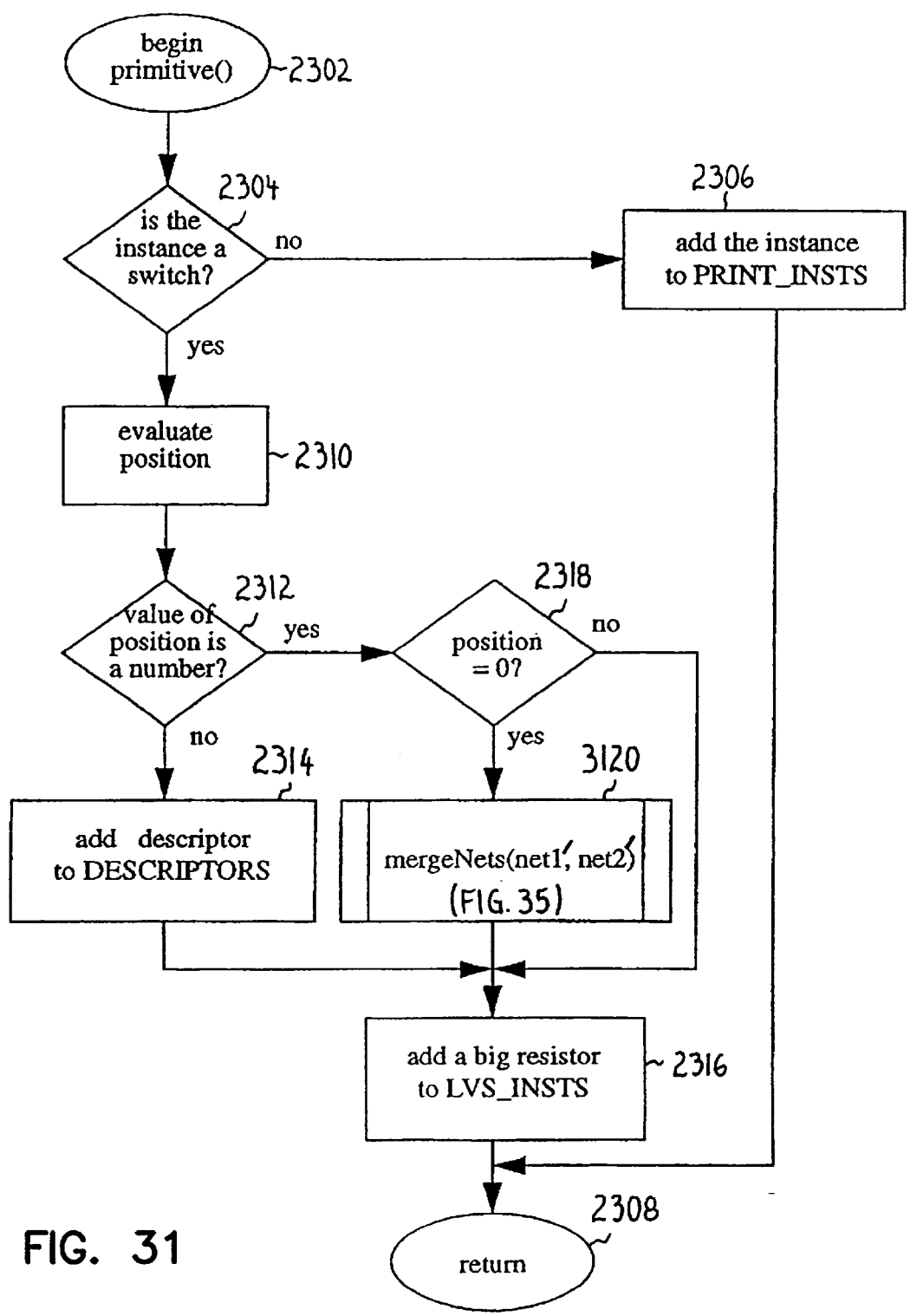
FIG. 31 is a process flow chart illustrating how a hierarchical netlist formatter deals with a primitive instance in a circuit in accordance with a further embodiment of the invention.
Figure 32:
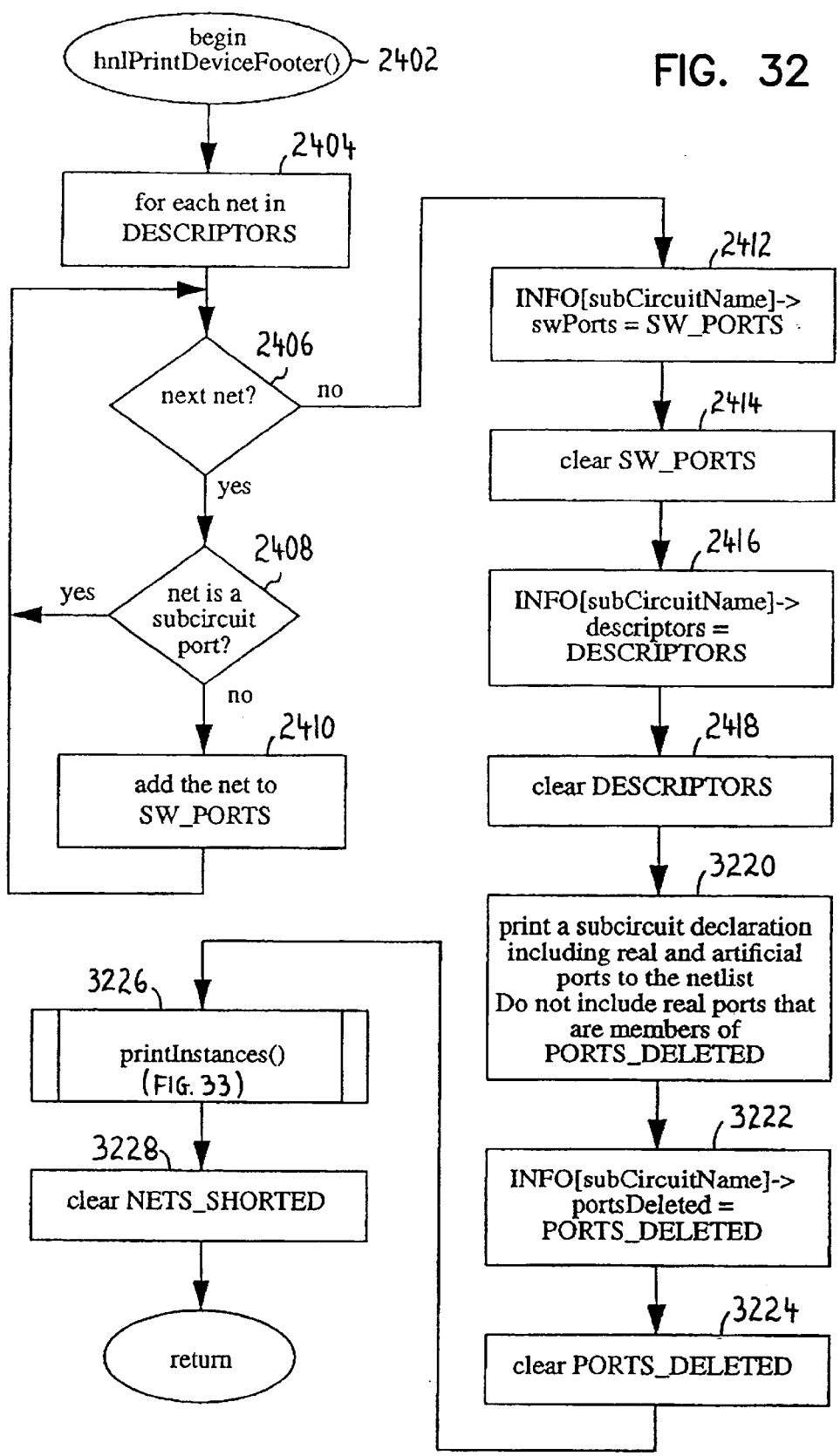
FIG. 32 is a process flow chart illustrating how the hierarchical netlist formatter completes a sub-circuit in accordance with the further embodiment of the invention.
Figure 33:
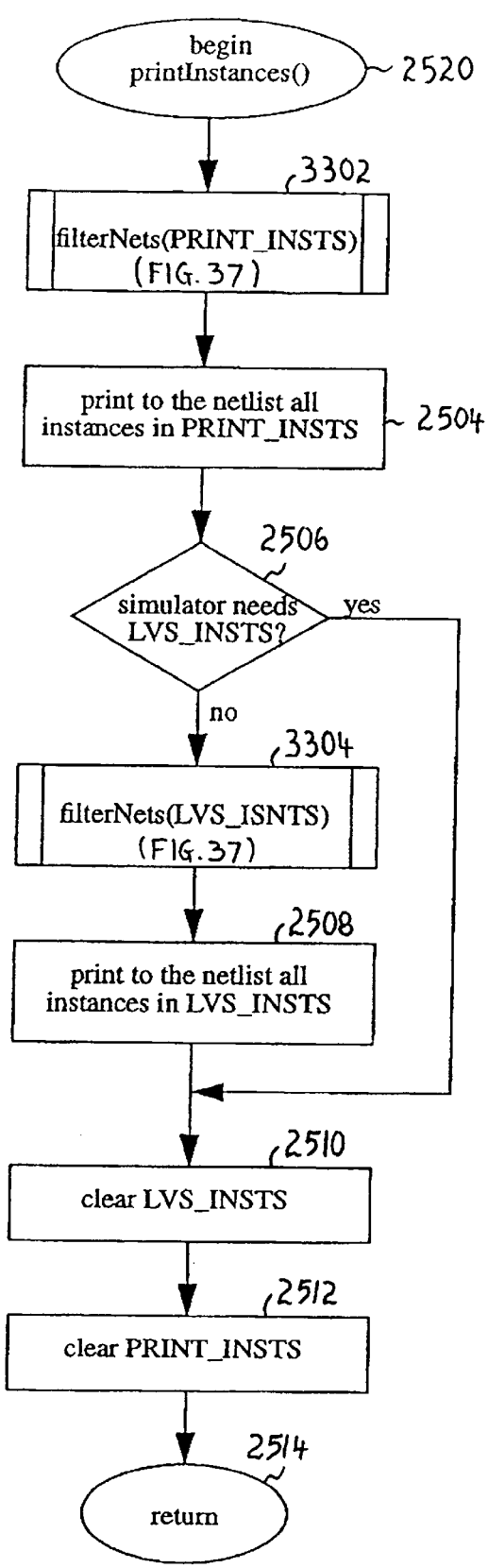
FIG. 33 is a process flow chart illustrating how the hierarchical netlist formatter prints instances in a sub-circuit in accordance with the further embodiment of the invention.
Figure 34:
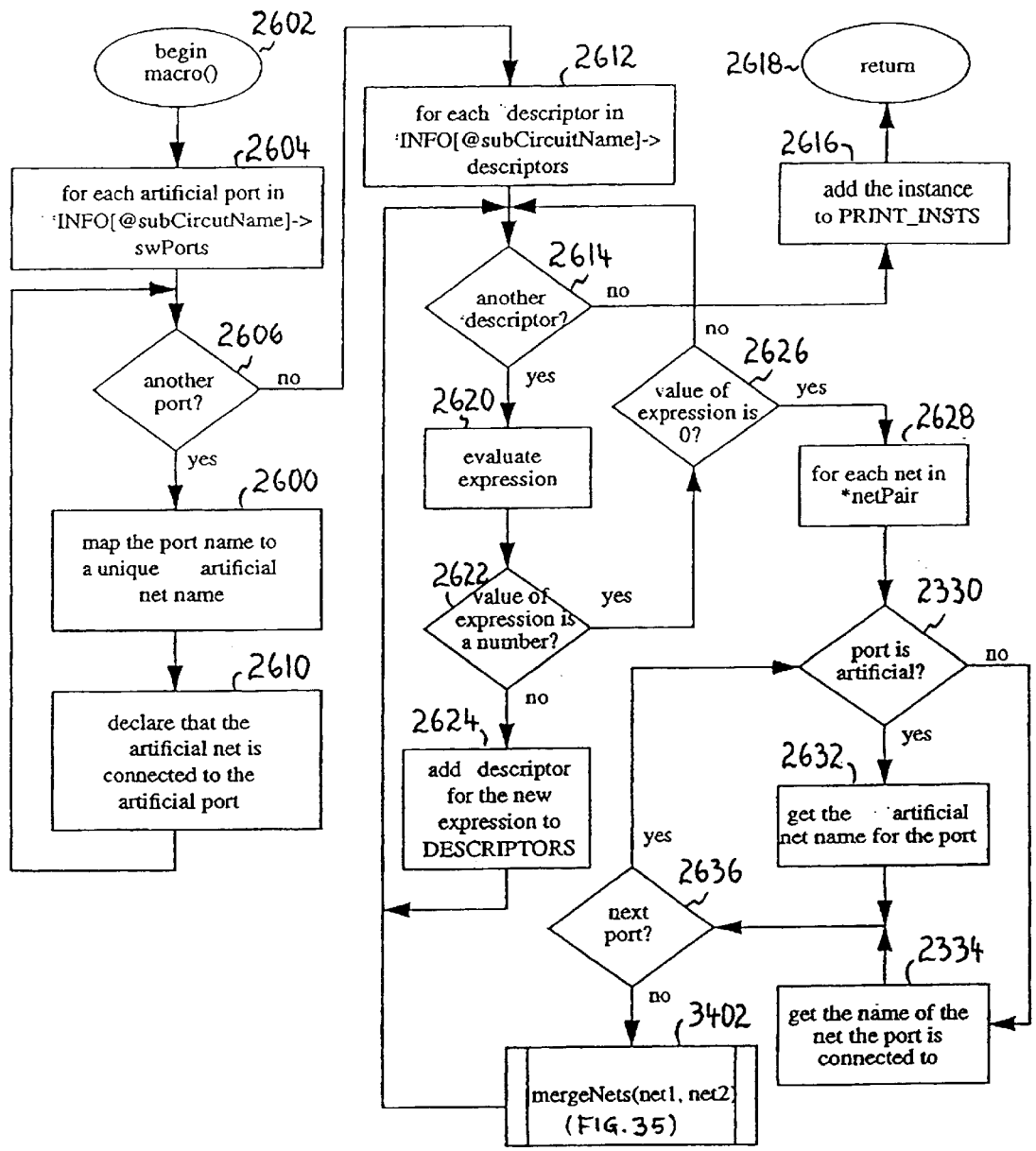
FIG. 34 is a process flow chart illustrating how the hierarchical netlist formatter deals with a sub-circuit instance in accordance with the further embodiment of the invention.

The following description of a procedure for merging two nets during the creation of a netlist file makes reference to the process flow charts shown in FIGS. 31–37. The netlist creation procedure illustrated by the process flow charts in FIGS. 31–37 is generally similar to the procedure described above with reference to FIGS. 21–27, and accordingly, similar or like steps of the process of FIGS. 31–37 have been given the same reference number as the corresponding steps of the process of FIGS. 21–27. FIG. 31 is a process flow chart illustrating how the hierarchical netlist formatter deals with a primitive instance when a pair of nets are merged, and corresponds generally to the procedure set forth in FIG. 23. FIG. 32 is a process flow chart illustrating how the hierarchical netlist formatter completes a sub-circuit, and corresponds generally to the procedure set forth in FIG. 24. FIG. 33 is a process flow chart illustrating how the hierarchical netlist formatter prints instances in a sub-circuit, and corresponds generally to the procedure set forth in FIG. 25. FIG. 34 is a process flow chart illustrating how the hierarchical netlist formatter deals with a sub-circuit instance, and corresponds generally to the procedure set forth in FIG. 26.

Digressing, referring to FIG. 8, the netlist creation procedure which merges nets uses the PORTS_DELETED list 829 and the look-up structure 830 that is named NETS_SHORTED. The PORTS_DELETED list 829 lists all of the ports for a sub-circuit that have been eliminated because of switches.

Figure 35:
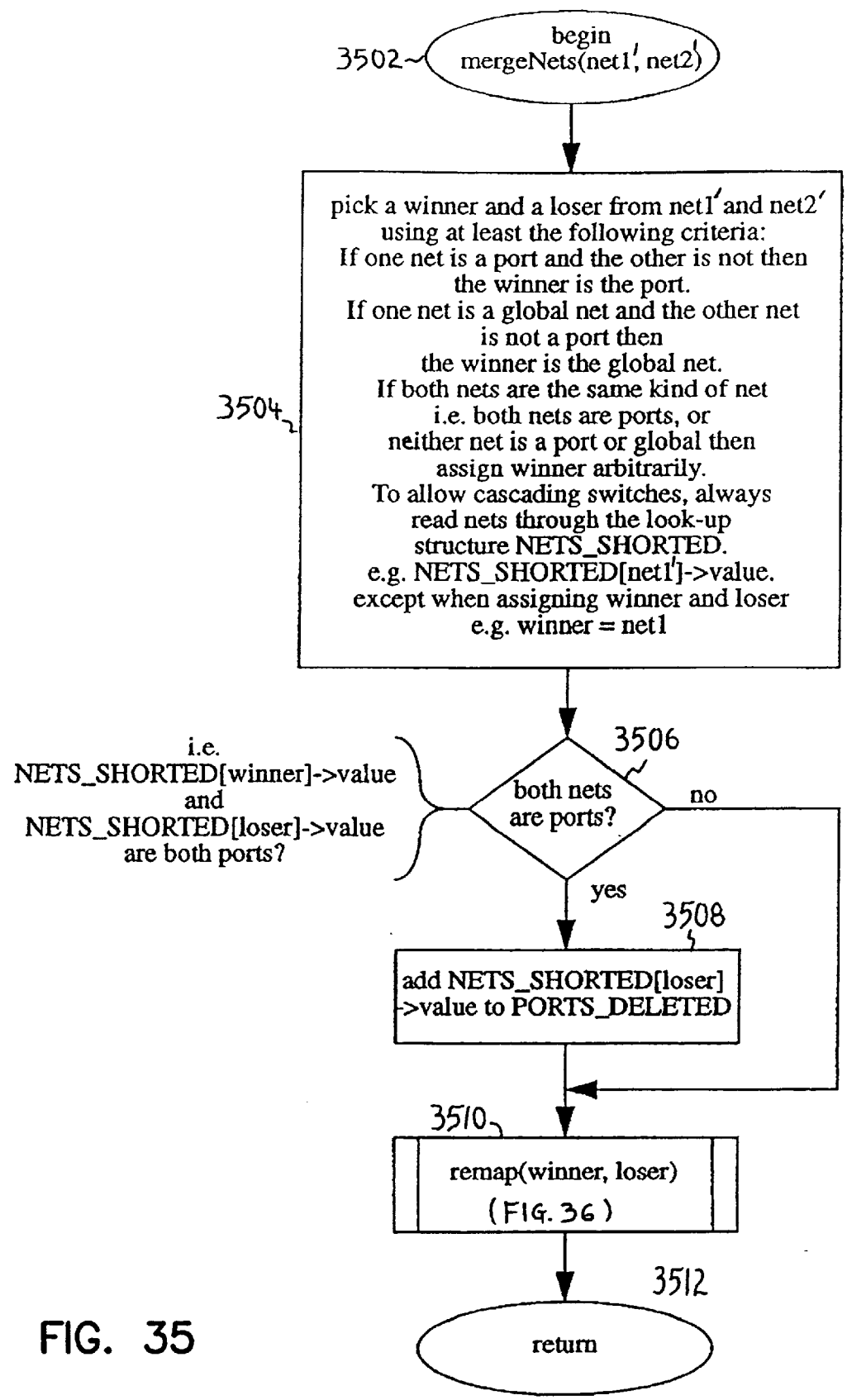
FIG. 35 is a process flow chart illustrating how the hierarchical netlist formatter merges two nets in accordance with the further embodiment of the invention in accordance with the further embodiment of the invention.

With regard to the look-up structure 830, each key has two parameters—"value" and "conquests". The parameter "value" is the name of the net the key is shorted to. The parameter "conquests" is a list of nets that have been merged into the key, as will be described. Usage of the parameter "value" is given in the following example. In the expression NETS_SHORTED[net1']→value=net2', the net1' is the key and net2' is the returned value. This means that net1' is shorted to net2'. It is pointed out that the terms net1' and net2' as used in this description and with reference to FIG. 35 are arbitrary terms, and have been given a prime notation (') to distinguish these terms from the terms "net 1" and "net 2" referred to above with respect to FIGS. 1–30. If "value" for a key is not defined, then the key is returned as the value. For example, the expression NETS_SHORTED[net1']→value will return net1' if the net is not shorted to another net through a switch. If a net is a value and is later shorted to a different net, the look-up structure 830 is updated so that all values of the look-up structure 830 having the same net are changed to the value of the different net instead. If both nets are sub-circuit ports, then one of the nets is arbitrarily assigned to be the key and the other is the value. The port that is determined to be the key is added to the PORTS_DELETED list 829.

The initial steps in creating a hierarchical netlist are the same as described above with reference to FIGS. 21–22, beginning with opening the schematic, traversing the hierarchy, locating instances and executing the function "hnlPrintInsts()" and the function "primitive()" (FIG. 31) up to step 2318, when the instance is a primitive instance, or the function "macro()" (FIG. 34), up to step 2636, when the instance is not a primitive instance. The procedure illustrated in FIG. 31 for primitive instances corresponds to the procedure described above with reference to FIG. 23, up to step 2318 where, if the parameter "position" evaluates to "0", step 3120 calls a function "mergeNets(net1', net2')" of the hierarchical netlist formatter 2050 for merging two nets. Similarly, the procedure illustrated in FIG. 34 for macro instances corresponds to the procedure described above with reference to FIG. 26 up to step 2636, where the procedure continues to step 3402 which calls the function mergeNets (net1', net2') for merging the two nets. The following description of the net merging procedure will be described with reference to instance "xi1" of sub-circuit C1, which is a macro instance.

Referring to FIG. 35, which is a process flow chart illustrating a function "mergeNets(net1', net2')", the function is called at step 3402 (FIG. 34) and begins at step 3502. Net1' and net2' are arguments to the procedure "mergeNets ()" and can represent any two arbitrary nets within a circuit. To simplify the illustration, the following description uses a specific example of merging two nets I1_net6 and I1_net3 that are associated with a switch. However, the procedure can be used to merge any two nets, or ports, associated with a switch and the exemplary embodiment is not intended as a limitation on the scope of the invention.

Step 3504 accesses the look-up structure NETS_SHORTED when referencing nets to account for processing of previous switches on either net. Step 3504 picks a "winner" and a "loser" from argument (net1', net2') using at least the following criteria. If one net is a port and the other is not, then the "winner" is the port. If one net is a global net and the other net is not a port, then the "winner" is the global net. If both nets are the same kind of net, i.e., if both nets are ports, or neither net is a port or global, then assign a "winner" arbitrarily. To allow cascading switches, always read nets through the NETS_SHORTED look-up structure 830, e.g., NETS_SHORTED[net1']→value, except when assigning "winner" and "loser" e.g., "winner"=net1'. Preferably, global shorts are not used and shorts of a port to a global are not used for this method. In the example, I1_net6 is "winner" and I1_net3 is "loser".

Step 3506 determines if both nets are ports. More specifically, step 3506 determines whether NETS_SHORTED[winner]→value and NETS_SHORTED[loser]→value are both ports. Step 3508 adds the NETS_SHORTED[loser]→value to the PORTS_DELETED list 829. In the example, neither net is a sub-circuit port. Step 3510 calls the function "remap(winner, loser)", the process flow chart for which is given by FIG. 36, illustrating how the hierarchical netlist formatter remaps the nets of a merged net pair, such as nets I1_net6 and I1_net3.

Figure 36:
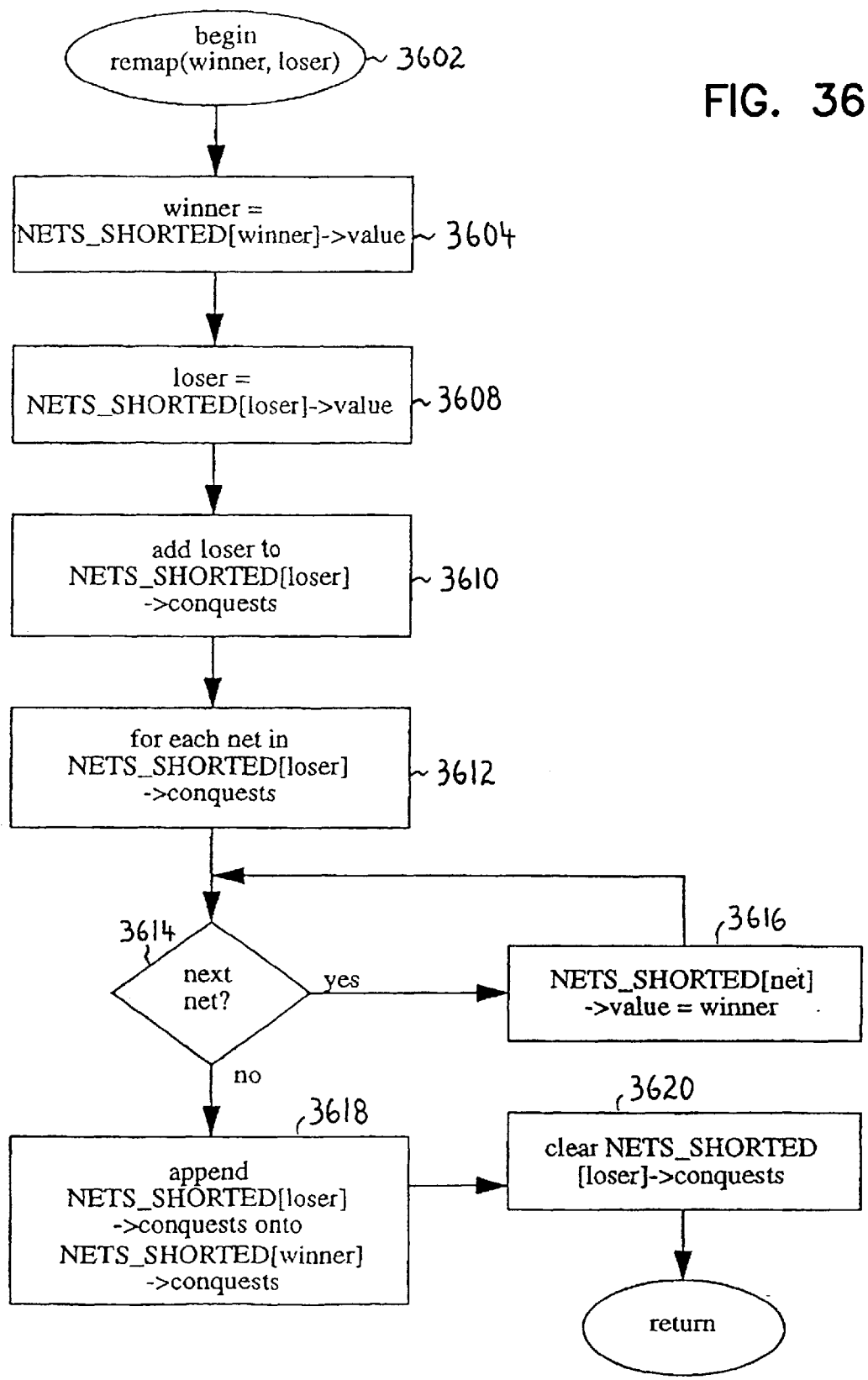
FIG. 36 is a process flow chart illustrating how the hierarchical netlist formatter remaps the nets of a merged net pair in accordance with the further embodiment of the invention.

Referring to FIG. 36, the function begins at step 3602, and steps 3604–3608 are effective for the case of cascaded switches, that is, the condition wherein a plurality of nets are connected to a common net by switches. In the present example, I1_net3 is being merged into I1_net6.

Step 3610 adds the "loser", net I1_net3 in the example, to its own list of "conquests". This information is stored in the look-up structure 830. The parameter "conquests" is a list which includes the net names of nets that have been merged into, or absorbed by a "winner" net. In this example, since net I1_net3 may have been a previous "winner", net I1_net3 is added to the list NETS_SHORTED["netI1_net3"]→conquests". This allows steps 3612–3616 in one operation to reassign all the nets that have been merged into the winner.

Steps 3612–3616 declare the winner to be the value for the loser net and all of the nets that were previously merged into the loser net. In the example, NETS_SHORTED ["netI1_net3"]→value is set to "I1_net6". If net I1_net3 had been a previous "winner", then NETS_SHORTED [netName]→value for all of the other nets in NETS_SHORTED["netI1_net3"]→conquests are also set to "netI1_net3". Step 3618 appends the "conquests" list for the "loser" net onto the "conquests" list for the "winner" net. Thus, in the example, NETS_SHORTED["netI1_net3"]→conquest is added to the list NETS_SHORTED["netI1_net6"]→conquests. Step 3620 clears the conquests list for the loser net. In the example, NETS_SHORTED["netI1_net3"]→conquests is cleared. The procedure returns to step 3512 (FIG. 35) which returns to step 2614 (FIG. 34), and assuming all descriptors have been processed, step 2616 adds the instance to PRINT_INSTS. The procedure returns to step 2110 (FIG. 21) to obtain the next instance.

When all instances at the current level of the hierarchy have been dealt with, the procedure flows through step 2116 (because this is not the top level) to step 2118 and calls the function "hnlPrintDeviceFooter()". Referring to FIG. 32, the procedure is the same as described for steps 2402–2418 with reference to FIG. 24. At step 3220, the sub-circuit declaration, including real and artificial ports, is printed to the netlist file. However, the real ports that are contained in the PORTS_DELETED file 829 are not added to the netlist file. Rather, step 3222 adds the names of any ports that have been deleted to the "INFO" look-up structure and these ports are filtered out during the printing of the instances of the current sub-circuit at higher levels of hierarchy. In the present example, no ports have been deleted. Step 3224 clears the PORTS_DELETED list 829. Step 3226 calls the function "printInstances()". The process flow diagram for the function "printInstances()" is illustrated in FIG. 33.

Referring to FIG. 33, the function "printInstances()" corresponds to that which has been described above with reference to FIG. 25 except that step 3302 calls the procedure "filterNets(PRINT_INSTS)" which accounts for net remapping in the circuit caused by the presence of switches prior to the instances in the list LVS_INSTS being printed to the netlist in step 2508. The PRINT_INSTS list 832 (and the LVS_INSTS list 833) contains all the necessary information required to print an instance to the netlist file, i.e., the instance ports, the nets that the instance ports are connected to, device parameters, etc.

Figure 37:
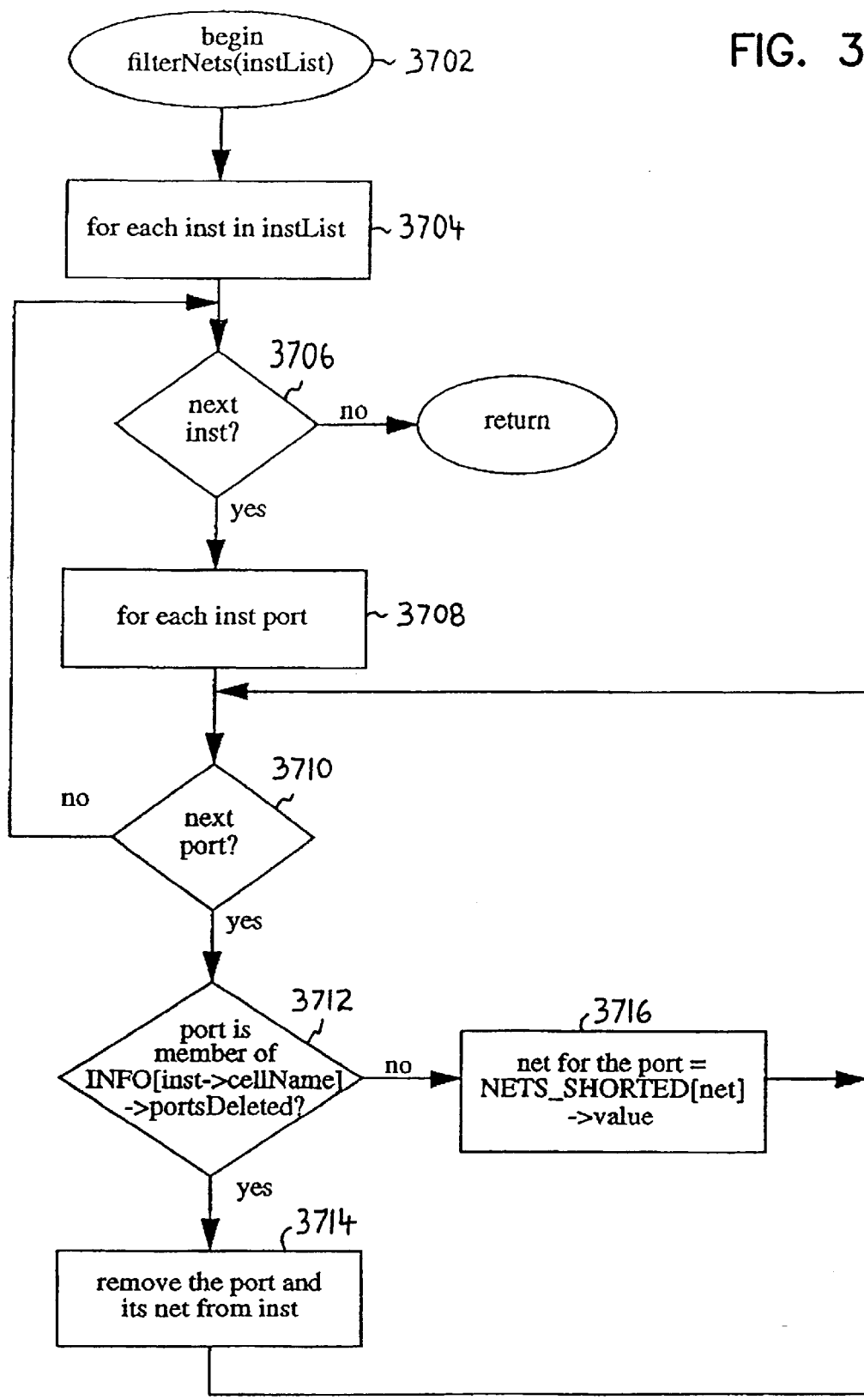
FIG. 37 is a process flow chart illustrating how the hierarchical netlist formatter filters nets in printing instances to the netlist when nets are merged in accordance with the further embodiment of the invention.

Referring to FIG. 37, which is a process flow chart illustrating how the hierarchical netlist formatter filters nets in printing instances to the netlist when nets are merged, the procedure begins at step 3702. At steps 3704–3706, obtain for each instance that is printed, the description of the instance to be printed. Steps 3708–3712 determine for each instance if any port name is contained in the list INFO [cellName] as being a port that has been deleted. If so, step 3714 removes the port and its net from the instance description so that the port and its net will not be added to the netlist file. If the port is not a port that has been deleted, step 3716 remaps the name of the net to the name of the net to which it is shorted. Thus, rather than eventually printing the net associated with the instance portName, the net contained in the look-up structure NETS_SHORTED[net]→value is printed.

For example, suppose there is an instance of "lowerCell" placed in "thisCell". The port names for the sub-circuit of "lowerCell" are "p1", "p2", "p3" "p4", and "p5" and the nets they are connected to for this instance of "lowerCell" within "thisCell" are "n1", "n2", "n3", "n4", and "n5". Also suppose that "n1" is shorted to "n2" through a switch. Further suppose that "p4" was shorted to "p5" through a switch within the sub-circuit for "lowerCell" and that "p4" is a member of the list INFO["lowerCell"]→portsDeleted. Rather than printing "p1" "p2" "p3" "p4" "p5" as the instance ports or printing "n1" "n2" "n3" "n4" "n5" as the instance nets to the netlist, ports are written as follows: "p1" "p2" "p3" "p5". Nets are written as follows: "n2" "n2" "n3" "n5".

In the present example, step 3716 adds net I1_net6 to the netlist file in place of the artificial net I1_net3. The procedure returns to step 2504 (FIG. 33) and prints all of the instances in PRINT_INSTS file 832 to the netlist file. The netlist created will be similar to netlist 1302 (FIG. 13) except that no resistor is declared on line 13.19 and line 13.19 declares net I1_net6 as being connected to both artificial ports of the circuit "bottom". Thus, line 13.18 appears as follows:

13.18 xi1 Ain Aout I1_net6 I1_net6 bottom

The procedure continues to step 2506, adding to the netlist the LVS information, if any, filtered by step 3304, or jumps to step 2510 to clear the list LVS_INSTS and proceeds to step 2512 to clear the PRINT_INSTS file. Then, step 2514 returns to step 2108 to open the next sub-circuit.

If when processing an instance, step 2204 (FIG. 22) determines that the instance is a primitive instance, the function "primitive()" is called at step 2206 and the procedure illustrated in FIG. 31 is followed. The procedure illustrated in FIG. 31 corresponds to the procedure described above with reference to FIG. 23 up to step 2318, but step 3120 calls the function mergeNets(net1', net2'). The net merging procedure is conducted in a manner similar to that described above with reference to locating a macro instance, and accordingly, will not be repeated.

Referring to FIG. 21, when all instances at all of the levels of hierarchy have been dealt with, from step 2112, the procedure steps to step 2116 and calls the function "hnlPrintTopCellFooter()", which procedure has already been described above with reference to FIG. 27.

In an alternative embodiment of a procedure for merging nets, for the case where both of the nets being merged are sub-circuit ports, a further descriptor can be added to the file DESCRIPTORS 831 (FIG. 8) in dealing with the sub-circuit instance that includes the ports. This allows the merging procedure to be dealt with at the next level of hierarchy by setting value equal to "0" as has been described above with reference to FIGS. 23 and 26, for example. However, unless both nets are sub-circuit ports, they are merged at the current instance.

Summary

Thus, it has been shown that the present invention provides a system and method for changing the connected behavior of a circuit design schematic by interpreting instance parameters at the time a netlist is being created. In accordance with the invention, to change the behavior of a circuit design, the designer assigns a parameter to each instance on the schematic that contains a switch. The parameter can have a value representing either that the switch is open or closed, or a value which indicates that the condition of the switch is determined at a higher level of schematic hierarchy. The parameter is evaluated at the time the netlist is created to determine the position of the switch. Thus, the invention allows the designer, at an arbitrary level of schematic hierarchy, to change the value of the parameter of these instances to thereby change how the circuit is connected. The connected configuration can be changed at any level in the hierarchy by simply changing an instance parameter. The present invention provides a way to minimize the number of schematics that are required to communicate the behavior of a circuit by allowing all of the basic functions of cells to be defined by one schematic. The switch function provided by the invention is particularly useful in an environment where a cell is replicated during the design operation process and where that cell is expected to function differently for different placements or instances. In such application, the invention obviates the need to create a large number of cells that have essentially the same function, and eliminates the need to create cells that require a large number of input/output ports. The exemplary embodiments are provided to illustrate implementations and applications of the invention and are not intended as a limitation on the scope of the invention as defined by the appended claims.

As has been shown, each switch, such as switch RSW3, appears as an instance on the netlist. In contrast, in the switch function provided by the Cadence software, nets, such as net6 and net3, would be merged, but the connected configuration cannot be changed at any level in the hierarchy by simply changing an instance parameter.

What is claimed is:

1. A method for changing the connected behavior of a circuit design schematic at the time a netlist file is being created from a schematic data file representing the circuit design schematic, the method comprising:

defining an instance of a switch and associated first and second nets;

entering a parameter into the schematic data file for the instance of the switch;

when creating the netlist file from the schematic data file detecting the instance of the switch and its parameter; and modifying the interconnectivity of the first and second nets when the parameter has a first value.

2. The method of claim 1, where modifying the interconnectivity of the first and second nets includes merging the first and second nets into a single net.

3. The method of claim 1, where modifying the interconnectivity of the first and second nets includes declaring a device for interconnecting the first and second nets.

4. The method of claim 1, where the circuit design schematic and the schematic data file have multiple levels in a hierarchy.

5. The method of claim 4, where the instance of the switch is defined at one of the levels, and the parameter is entered at another of the levels.

6. The method of claim 5, where the other level is higher in the hierarchy than the one level.

7. The method of claim 4, where the created netlist file is a flat netlist file.

8. The method of claim 1, wherein the netlist file that is created is a hierarchical netlist file.

9. A method for changing the connected behavior of a circuit design schematic at the time a netlist file is being created from a schematic data file representing the circuit design schematic, the schematic data file including at least one instance of a switch having associated first and second nets, the method comprising:

entering a parameter into the schematic data file for the instance of the switch;

when creating the netlist file from the schematic data file detecting the instance of the switch and its parameter; and modifying the interconnectivity of the first and second nets when the parameter has a first value.

10. The method of claim 9, where the circuit design schematic and the schematic data file have multiple levels in a hierarchy.

11. The method of claim 10, where the instance of the switch is defined at one of the levels, and the parameter is entered at another of the levels.

12. A method for changing the connected behavior of a circuit design schematic at the time a netlist file is being created from a schematic data file representing the circuit design schematic, the method comprising:

defining multiple instances of a switch and multiple sets of nets associated with respective ones of the instances;

entering parameters into the schematic data file for at least some of the instances of the switch;

when creating the netlist file from the schematic data file detecting the instances of the switch and the values of their parameters; and modifying the interconnectivity of the sets of nets according to the values of different ones of the parameters.

13. The method of claim 12, where modifying the interconnectivity of the sets of nets includes merging predetermined ones of the nets together.

14. The method of claim 13, where one value of the parameter for any of the switch instances causes the nets of the set for that switch instance to be merged.

15. The method of claim 13, where another value of a parameter for any of the switch instances causes the nets of the set for that switch instance not to be merged.

16. The method of claim 12, where the circuit design schematic and the schematic data file have multiple levels.

17. The method of claim 16, where different ones of the switch instances are defined in different ones of the levels.

18. The method of claim 16, where some of the switch instances are defined in levels different from the levels in which the parameters for their respective instances are entered.

19. The method of claim 18, where a parameter for one of the switch instances has a particular value for modifying the interconnectivity of the sets of nets for that switch instance according to a different one of the parameters.

20. A method for changing the connected behavior of a circuit design schematic at the time a netlist file is being created from a circuit design schematic data file that includes an instances of a switch, sets of nets associated with the instances, and parameters associated with respective ones of the instances, the method comprising:

detecting one of the instances of the switch and the value of its respective parameter; and modifying the interconnectivity of predetermined ones of the nets for at least one value of the parameter.

21. The method of claim 20, where modifying the interconnectivity of the nets includes merging predetermined ones of the nets together.

22. The method of claim 20, where modifying the interconnectivity of the predetermined ones of the nets includes declaring a device for interconnecting the predetermined ones of the nets.

23. The method of claim 20, where the circuit design schematic and the schematic data file have multiple levels in a hierarchy.

24. The method of claim 23, where the instance of the switch is defined at one of the levels, and the parameter is entered at another of the levels.

25. The method of claim 23, where a parameter for one of the switch instances has a particular value for modifying the interconnectivity of the sets of nets for that switch instance according to a different one of the parameters.

26. A method for changing the connected behavior of a circuit design schematic at the time a netlist file is being created from a schematic data file representing the circuit design schematic, the method comprising:

defining multiple instances of a switch and multiple sets of nets associated with respective ones of the instances; and entering parameters into the schematic data file for at least some of the instances of the switch, the parameters specifying the interconnection of certain of the nets when the netlist file is created.

27. The method of claim 26, where the parameters have at least two possible values, one of the values specifying that the certain nets are to be interconnected.

28. The method of claim 27, where another of the parameter values specify that the certain nets are not to be interconnected.

29. The method of claim 26, where the circuit design schematic and the schematic data file have multiple levels in a hierarchy.

30. The method of claim 29, where an instance of the switch is defied at one of the levels, and the parameter associated with that instance is entered at another of the levels.

31. The method of claim 30, where the other level is higher in the hierarchy than the one level.

32. The method of claim 29, wherein at least one of the parameters have a value specifying that the certain nets are to be interconnected according to the value of a further parameter.

33. The method of claim 32, further comprising entering the further parameter at a level different from the level at which the at least one parameter is specified.

34. A system for changing the connected behavior of a circuit design schematic by interpreting instance parameters at the time a netlist file is being created from a schematic data file representing the circuit design schematic, wherein the circuit design schematic includes an instance of a switch having associated first and second nets; said system comprising:

an input mechanism for entering a parameter into the schematic data file for the instance of the switch; and a traversal engine for creating the netlist file from the schematic data file, said traversal engine traversing the schematic to locate the instance of the switch and to modify the inteconnectivity of the first and second nets when the parameter evaluates to a predetermined value.

35. The system of claim 34, where the circuit design schematic has multiple levels, and where the engine traverses the levels hierarchically.

36. The system of claim 35, where the engine locates the instance of the switch and the value of the parameter at different levels of the schematic data file.

37. A system for changing the connected behavior of a circuit design schematic at the time a netlist file is being created from a schematic data file representing the circuit design schematic, the system method comprising:

a first input mechanism for entering multiple instances of a switch and multiple sets of nets associated with respective ones of the instances;

a second input mechanism for entering parameters into the schematic data file for at least some of the instances of the switch; and a traversal engine for creating the netlist file from the schematic data file by detecting the instances of the switch and the values of the parameters and modifying the interconnectivity of the sets of nets in response to those values.

38. The system of claim 37, where the circuit design schematic has multiple levels, and where the engine traverses the levels hierarchically.

39. The system of claim 38, where the engine locates one of the instances of the switch and the value of the parameter for that instance at different levels of the schematic data file.

40. A traversal engine for changing the connected behavior of a circuit design schematic at the time a netlist file is being created from a circuit design schematic data file that includes an instances of a switch, sets of nets associated with the instances, and parameters associated with respective ones of the instances, the traversal engine system comprising:

means for locating one of the instances of the switch and the value of its respective parameter; and means for modifying the interconnectivity of predetermined ones of the nets for at least one value of the parameter.

41. The traversal engine of claim 40, where the circuit design has multiple levels, and where the locating means searches the levels hierarchically.

42. The traversal engine of claim 41, where the locating means detects the one instance of the switch and the value of the parameter for that instance at different levels of the schematic data file.

43. A system for specifying, before a netlist is created, the connected behavior of a circuit design schematic at the time the netlist file is later created from a schematic data file representing the circuit design schematic, the system comprising:

first means for inputting multiple instances of a switch and multiple sets of nets associated with respective ones of the instances; and second means for inputting parameters into the schematic data file for at least some of the instances of the switch, the parameters specifying the interconnection of certain of the nets when the netlist file is later created.

44. The system of claim 43, where the parameters have at least two possible values, one of the values specifying that the certain nets are to be interconnected when the netlist is later created.

45. The method of claim 44, where another of the parameter values specify that the certain nets are not to be interconnected when the netlist is later created.

46. The method of claim 43, where the circuit design schematic and the schematic data file have multiple levels in a hierarchy.

47. The method of claim 46, wherein at least one of the parameters have a value specifying that the certain nets are to be interconnected according to the value of a further parameter.

48. The method of claim 47, further comprising entering the further parameter at a level different from the level at which the at least one parameter is specified.

49. A computer readable medium having represented therein instructions and data for performing in a digital computer a method for changing the connected behavior of a circuit design schematic at the time a netlist file is being created from a circuit design schematic data file that includes multiple instances of a switch, sets of nets associated with the instances, and parameters associated with respective ones of the instances, the method comprising:

detecting one of the instances of the switch and the value of its respective parameter; and modifying the interconnectivity of predetermined ones of the nets for at least one value of the parameter.

50. The medium of claim 49, where the method further comprises entering the parameter of the one instance into the schematic data file.

51. The medium of claim 50, where the method further comprises defining the one instance of the switch and the set of nets associated with die one instance.

52. A computer readable medium having a representation of a schematic data file having a plurality of nets, the medium including at least one instance of a switch, a designation of a set of the nets that are associated with the instance of the switch, and a parameter capable of specifying whether the set of nets are to be interconnected when the parameter has a predetermined value.

53. The medium of claim 52, where the schematic data file includes multiple instances of the switch, each of the instances having its own associated set of nets and its own parameter.

54. The medium of claim 52, where the schematic data file has multiple levels in a hierarchy.

55. The medium of claim 54, where one of the parameters associated with one of the instances at one of the levels has a value indicating that another of the peters at another of the levels specifies whether the nets associated with the one parameter are to be interconnected.

* * * * *

UNITED STATES PATENT AND TRADEMARK OFFICE
CERTIFICATE OF CORRECTION

PATENT NO.:5,946,218

DATED: Aug. 31, 1999

INVENTOR(S) :Taylor et al

It is certified that error appears in the above-identified patent and that said Letters Patent is hereby corrected as shown below:

In column 27, line 1, delete "die" and insert -- the --, therefore.

In column 28, line 59, delete "defied" and insert --defined--, therefore.

In column 29, line 28, delete "method", therefore.

In column 29, line 51, delete "system", therefore.

In column 30, line 47, delete "die" and insert --the--, therefore.

In column 30, line 62, delete "peters" and insert --parameters--, therefore.

Signed and Sealed this

Ninth Day of May, 2000

*Attest:*

Q. TODD DICKINSON

*Attesting Officer*     *Director of Patents and Trademarks*